United States Patent
Preble et al.

(10) Patent No.: US 8,349,711 B2
(45) Date of Patent: Jan. 8, 2013

(54) SINGLE CRYSTAL GROUP III NITRIDE ARTICLES AND METHOD OF PRODUCING SAME BY HVPE METHOD INCORPORATING A POLYCRYSTALLINE LAYER FOR YIELD ENHANCEMENT

(75) Inventors: Edward A. Preble, Raleigh, NC (US); Lianghong Liu, Cary, NC (US); Andrew D. Hanser, Raleigh, NC (US); N. Mark Williams, Raleigh, NC (US); Xueping Xu, Stamford, CT (US)

(73) Assignee: Kyma Technologies, Inc., Raleigh, NC (US)

( * ) Notice: Subject to any disclaimer, the term of this patent is extended or adjusted under 35 U.S.C. 154(b) by 129 days.

(21) Appl. No.: 13/015,303

(22) Filed: Jan. 27, 2011

(65) Prior Publication Data
US 2011/0198590 A1   Aug. 18, 2011

Related U.S. Application Data

(63) Continuation of application No. 11/606,783, filed on Nov. 30, 2006, now Pat. No. 7,897,490.

(60) Provisional application No. 60/749,728, filed on Dec. 12, 2005, provisional application No. 60/750,982, filed on Dec. 16, 2005, provisional application No. 60/810,537, filed on Jun. 2, 2006, provisional application No. 60/843,036, filed on Sep. 8, 2006, provisional application No. 60/847,855, filed on Sep. 28, 2006.

(51) Int. Cl.
*H01L 21/00* (2006.01)
(52) U.S. Cl. ............... 438/478; 438/689; 257/E21.108; 257/E21.123; 257/E21.125; 257/E29.007; 257/E29.068

(58) Field of Classification Search .................... 438/60, 438/478–489, 689–693; 257/E21.108, 123, 257/125, 29.007, 68, 31.001
See application file for complete search history.

(56) References Cited

U.S. PATENT DOCUMENTS

| 5,563,422 A | 10/1996 | Nakamura et al. |
| 5,611,955 A | 3/1997 | Barrett et al. |
| 5,868,837 A | 2/1999 | DiSalvo et al. |
| 6,086,673 A | 7/2000 | Molnar |

(Continued)

OTHER PUBLICATIONS

Yoshida et al., "Improvements on the electrical and luminescent properties of reactive molecular beam epitaxially grown GaN films by using AlN-coated sapphire substrates," Appl. Phys. Let., vol. 42, No. 5, pp. 427-429 (Mar. 1, 1983).

(Continued)

*Primary Examiner* — Michael Lebentritt
(74) *Attorney, Agent, or Firm* — Bingham McCutchen LLP

(57) ABSTRACT

In a method for making a GaN article, an epitaxial nitride layer is deposited on a single-crystal substrate. A 3D nucleation GaN layer is grown on the epitaxial nitride layer by HVPE under a substantially 3D growth mode. A GaN transitional layer is grown on the 3D nucleation layer by HVPE under a condition that changes the growth mode from the substantially 3D growth mode to a substantially 2D growth mode. A bulk GaN layer is grown on the transitional layer by HVPE under the substantially 2D growth mode. A polycrystalline GaN layer is grown on the bulk GaN layer to form a GaN/substrate bi-layer. The GaN/substrate bi-layer may be cooled from the growth temperature to an ambient temperature, wherein GaN material cracks laterally and separates from the substrate, forming a free-standing article.

18 Claims, 13 Drawing Sheets

U.S. PATENT DOCUMENTS

| | | | |
|---|---|---|---|
| 6,086,734 | A | 7/2000 | Harada |
| 6,110,809 | A | 8/2000 | Sze et al. |
| 6,146,457 | A | 11/2000 | Solomon |
| 6,156,581 | A | 12/2000 | Vaudo et al. |
| 6,177,688 | B1 | 1/2001 | Linthicum et al. |
| 6,255,198 | B1 | 7/2001 | Linthicum et al. |
| 6,261,929 | B1 | 7/2001 | Gehrke et al. |
| 6,265,289 | B1 | 7/2001 | Zheleva et al. |
| 6,273,948 | B1 | 8/2001 | Porowski et al. |
| 6,274,518 | B1 | 8/2001 | Yuri et al. |
| 6,380,108 | B1 | 4/2002 | Linthicum et al. |
| 6,403,451 | B1 | 6/2002 | Linthicum et al. |
| 6,413,627 | B1 | 7/2002 | Motoki et al. |
| 6,440,823 | B1 | 8/2002 | Vaudo et al. |
| 6,447,604 | B1 | 9/2002 | Flynn et al. |
| 6,468,347 | B1 | 10/2002 | Motoki et al. |
| 6,468,882 | B2 | 10/2002 | Motoki et al. |
| 6,488,767 | B1 | 12/2002 | Xu et al. |
| 6,521,514 | B1 | 2/2003 | Gehrke et al. |
| 6,528,394 | B1 | 3/2003 | Lee |
| 6,533,874 | B1 | 3/2003 | Vaudo et al. |
| 6,596,079 | B1 | 7/2003 | Vaudo et al. |
| 6,608,327 | B1 | 8/2003 | Davis et al. |
| 6,616,757 | B1 | 9/2003 | Melnik et al. |
| 6,649,287 | B2 | 11/2003 | Weeks, Jr. et al. |
| 6,652,648 | B2 | 11/2003 | Park |
| 6,656,823 | B2 | 12/2003 | Lee et al. |
| 6,667,184 | B2 | 12/2003 | Motoki et al. |
| 6,686,261 | B2 | 2/2004 | Gehrke et al. |
| 6,692,568 | B2 | 2/2004 | Cuomo et al. |
| 6,693,021 | B1 | 2/2004 | Motoki et al. |
| 6,750,121 | B1 | 6/2004 | Kim |
| 6,765,240 | B2 | 7/2004 | Tischler et al. |
| 6,768,146 | B2 | 7/2004 | Yoshida |
| 6,773,504 | B2 | 8/2004 | Motoki et al. |
| 6,784,085 | B2 | 8/2004 | Cuomo et al. |
| 6,812,053 | B1 | 11/2004 | Kong et al. |
| 6,824,610 | B2 | 11/2004 | Shibata et al. |
| 6,897,483 | B2 | 5/2005 | Zheleva et al. |
| 6,909,165 | B2 | 6/2005 | Nakayama et al. |
| 6,923,859 | B2 | 8/2005 | Kim |
| 6,924,159 | B2 | 8/2005 | Usui et al. |
| 7,012,318 | B2 | 3/2006 | Motoki et al. |
| 7,118,813 | B2 | 10/2006 | Xu et al. |
| 7,253,499 | B2 | 8/2007 | Shibata |
| 7,303,630 | B2 | 12/2007 | Motoki et al. |
| 7,323,256 | B2 * | 1/2008 | Xu et al. .................. 428/698 |
| 7,674,699 | B2 | 3/2010 | Shibata |
| 7,687,827 | B2 | 3/2010 | Piner et al. |
| 7,777,217 | B2 | 8/2010 | Preble et al. |
| 2002/0068201 | A1 | 6/2002 | Vaudo et al. |
| 2002/0069816 | A1 | 6/2002 | Gehreke et al. |
| 2003/0157376 | A1 | 8/2003 | Vaudo et al. |
| 2003/0207125 | A1 | 11/2003 | Sunakawa et al. |
| 2004/0080010 | A1 | 4/2004 | Parikh et al. |
| 2004/0115937 | A1 * | 6/2004 | Nagai et al. .................. 438/689 |
| 2004/0124434 | A1 | 7/2004 | D'Evelyn et al. |
| 2005/0009310 | A1 | 1/2005 | Vaudo et al. |
| 2005/0098095 | A1 | 5/2005 | D'Evelyn et al. |
| 2005/0103257 | A1 | 5/2005 | Xu et al. |
| 2005/0133818 | A1 | 6/2005 | Johnson et al. |
| 2005/0167775 | A1 | 8/2005 | Nagy et al. |
| 2006/0003556 | A1 | 1/2006 | Lee et al. |
| 2007/0138505 | A1 * | 6/2007 | Preble et al. .................. 257/190 |
| 2007/0141823 | A1 | 6/2007 | Preble et al. |
| 2010/0140755 | A1 * | 6/2010 | Atanackovic .................. 257/632 |
| 2010/0213576 | A1 | 8/2010 | Hiranaka et al. |
| 2011/0042682 | A1 * | 2/2011 | Preble et al. .................. 257/76 |

OTHER PUBLICATIONS

Amano et al., "Metalorganic vapor phase epitaxial growth of a high quality GaN film using an AlN buffer layer," Appl. Phys. Let., vol. 48, No. 5, pp. 353-355 (Feb. 3, 1986).

Nakamura, "GaN growth using GaN buffer Layer," Jpn. J. Appl. Phys., vol. 30, No. 10A, pp. L1705-L1707 (Oct. 1991).

Strite et al., "GaN, AlN, and InN: A review," J. Vac. Sci. Technol., vol. 10, No. 4, pp. 1237-1266 (Jul./Aug. 1992).

Bauer et al., "Infrared luminescence of residual iron deep level acceptors in gallium nitride (GaN) epitaxial layers," Appl. Phys. Ltrs., vol. 64, No. 7, pp. 857-859 (Feb. 14, 1994).

Lester et al., "High dislocation densities in high efficiency GaN-based light-emitting diodes," Appl. Phys. Let., vol. 66, No. 10, pp. 1249-1251 (Mar. 6, 1995).

Nakamura et al., "Superbright green InGaN single-quantum-well-structure light-emitting diodes," Jpn. J. Appl. Phys., vol. 34, Part 2, No. 10B, pp. L1332-L1335 (Oct. 15, 1995).

Rosner et al., "Correlation of cathodoluminescence inhomogeneity with microstructural defects in epitaxial GaN grown by metalorganic chemical-vapor deposition," Appl. Phys. Let., vol. 70, No. 4, pp. 420-422 (Jan. 1997).

Heitz et al., "Excited states of $Fe^{3+}$ in GaN," Phy. Rev. B., vol. 55, No. 7, pp. 4382-4387 (Feb. 15, 1997).

Sugiura, "Dislocation motion in GaN light-emitting devices and its effects on device lifetime," J. Appl. Phys., vol. 81, No. 4, pp. 1633-1638 (Feb. 15, 1997).

Nakamura et al., "Room-temperature continuous-wave operation of InGaN multi-quantum-well structure laser diodes with a lifetime of 27 house," Appl. Phys. Let., vol. 70, No. 11, pp. 1417-1419 (1997).

Weimann et al., "Scattering of electrons at threading dislocations in GaN," J. Appl. Phys., vol. 83, No. 7, pp. 3656-3659 (Apr. 1, 1998).

Ng et al., "The role of dislocation scattering in n-type GaN films," Appl. Phys. Let., vol. 73, No. 6, pp. 821-823 (Aug. 10, 1998).

Look et al., "Dislocation Scattering in GaN," Phys. Rev. Let., vol. 82, No. 6, pp. 1237-1240 (Feb. 8, 1999).

Rosner et al., "Cathodoluminescence mapping of epitaxial lateral overgrowth in gallium nitride," Appl. Phys. Let., vol. 74, No. 14, pp. 2035-2037 (Apr. 5, 1999).

Trivedi et al., "Performance evaluation of high-power wide band-gap semiconductor rectifiers," J. Appl. Phys., vol. 85, No. 9, pp. 6889-6897 (May 1, 1999).

Kuznetsov et al., "Insulating GaN: Zn layers grown by hydride vapor phase epitaxy on SiC substrates," Appl. Phys. Let., vol. 75, No. 20, pp. 3138-3140 (Nov. 15, 1999).

Misra et al., "Investigation of vertical transport in n-GaN films grown by molecular beam epitaxy using Schottky barrier diodes," Appl. Phys. Let., vol. 76, No. 8, pp. 1045-1047 (Feb. 21, 2000).

Polyakov et al., "Electrical properties and defect states in undoped high-restivity GaN films used in high-power rectifiers," J. Vac. Sci. Tech., B. vol. 18, No. 3, pp. 1237-1243 (May/Jun. 2000).

Dang et al., "High breakdown voltage Au/Pt/GaN Schottky diodes," J. Vac. Sci. Technol., A, vol. 18, No. 4, pp. 1135-1138 (Jul./Aug. 2000).

Karrer et al., "Influence of crystal polarity on the properties of Pt/GaN Schottky diodes," Appl. Phys. Let., vol. 77, No. 13, pp. 2012-2014 (Sep. 22, 2000).

Pearton et al., "Fabrication and performance of GaN electronic devices," Materials Science and Engineering, R30, pp. 55-212 (2000).

Etzkorn et al., "Cracking of GaN Films," J. Appl. Phys., vol. 89, No. 2, pp. 1025-1034 (Jan. 15, 2001).

Zhang et al., "Vertical and lateral GaN rectifiers on free-standing GaN substrates," Appl. Phys. Let., vol. 79, No. 10, pp. 1555-1557 (Sep. 3, 20010).

Shin et al., "Superior Characteristics of $RuO_2$/GaN Schottky-Type UV Photodetector," Phys. Stat. Sol. A., vol. 188, No. 1, pp. 341-344 (2001).

Karpov et al., "Dislocation effect on light emission efficiency in gallium nitride," Appl. Phys. Let., vol. 81, Nov. 25, pp. 4721-4723 (Dec. 16, 20020).

Johnson et al., "Breakdown voltage and reverse recovery characteristics of free-standing GaN Schottky Rectifiers," IEEE Transactions on Electronic Devices, vol. 49, No. 1, pp. 32-36 (2002).

Heikman, "Growth of Fe doped semi-insulating GaN by metalorganic chemical vapor deposition," Appl. Phys. Let., vol. 80, No. 3, pp. 347-349 (2002).

Katz et al., "Anisotropy in detectivity of GaN Schottky ultraviolet detectors: comparing lateral and vertical geometry," Appl. Phys. Let., vol. 80, No. 3, pp. 347-349 (2002).

Baik et al., "160-A bulk GaN Schottky diode array," Appl. Phys. Let., vol. 83, No. 15, pp. 3192-3194 (2003).

Kang et al., "Temperature dependent characteristics of bulk GaN Schottky rectifiers on free-stnading GaN substrates," J. Vac. Sci. Technol., B. vol. 22, No. 2, pp. 710-714 (2004).

Walters,"Rectifier reverse switching performance," MicroNote Series 302, Microsemi, 3 pages (Jul. 2003).

Otoki et al., "GaN-HEMT on 100mm diameter sapphire substrate grown by MOVPE," 2003 International Conference on Compound Semiconductor Mfg., GaAs MANTECH, pp. 1-4 (2003).

Balmer et al., "GaN-based heterojunction FET's on 100mm Si Substrates," 2$^{nd}$ EMRS DTC Technical Conference, Edinburgh, A24, 6pages (2005).

Beccard et al., "Growth of semi-insulating InP:Fe in the low pressure hydride VPE system," Cryst. Growth, vol. 121, pp. 373-380 (1992).

Porowski et al., "Thermodynamical properties of III-V nitrides and crystal growth of GaN at high $N_2$ pressure," J. Crystal Growth, vol. 178, pp. 174-188 (1997).

Shur, "GaN based transistors for high power applications," Solid-State Electronics, vol. 42, No. 12, pp. 2131-2138 (1998).

Kelly et al., "Large free-standing GaN substrates by hydride vapor phase epitay and laser-induced liftoff," Jpn. J. Appl. Phys., vol. 38, pp. L217-L219 (1999).

Z. Suo, "Fracture in thin films," Encyclopedia of Materials: Science and Technology, Elsevier Science (Jun. 26, 2000).

Chyi et al., "Temperature dependence of GaN high breakdown voltage diode rectifiers," Solid-State Electronics, vol. 44, pp. 613-617 (2000).

Johnson et al., "Schottky rectifiers fabricated on free-standing GaN substrates," Solid-State Electronics, vol. 45, pp. 405-410 (2001).

Yasan et al., "Comparison of ultraviolet light-emitting diodes with peak emission at 340 nm grown on GaN substrate and sapphire," Applied Phys. Let., vol. 81, No. 12, pp. 2151-2154 (Sep. 16, 2002).

Akita et al., "Advantages of GaN Substrates in InAlGaN quaternary ultraviolet-ligh-emitting diodes," Jpn. Journal of Appl. Phys., vol. 43, No. 12, pp. 8030-8031 (2004).

Monemar et al., "Growth of thick GaN layers with hydride vapour phase epitaxy," J. Crystal Growth 281, pp. 17-31 (2005).

Tomiya et al., "Structural defects related issues of GaN-based laser didoes," Mater. Res. Soc. Symp. Proc., vol. 831, pp. E1.1.1-E1.1.11 (2005).

Corrion et al., "Growth of Fe-doped GaN by RF plasma-assisted molecular beam epitaxy," J. of Crystal Growth, vol. 289, pp. 587-595 (2006).

\* cited by examiner

US 8,349,711 B2

SINGLE CRYSTAL GROUP III NITRIDE ARTICLES AND METHOD OF PRODUCING SAME BY HVPE METHOD INCORPORATING A POLYCRYSTALLINE LAYER FOR YIELD ENHANCEMENT

CROSS-REFERENCE TO RELATED APPLICATIONS

This application is a continuation of U.S. patent application Ser. No. 11/606,783, filed on Nov. 30, 2006, which claims the benefit of U.S. Provisional Patent Application Ser. No. 60/749,728, filed Dec. 12, 2005, titled "Bulk Gallium Nitride Crystals and Method of Making the Same;" U.S. Provisional Patent Application Ser. No. 60/750,982, filed Dec. 16, 2005, titled "Method of Producing Freestanding Gallium Nitride by Self-Separation;" U.S. Provisional Patent Application Ser. No. 60/810,537, filed Jun. 2, 2006, titled "Low Defect GaN Films Useful for Electronic and Optoelectronic Devices and Method of Making the Same;" U.S. Provisional Patent Application Ser. No. 60/843,036, filed Sep. 8, 2006, titled "Methods for Making Inclusion-Free Uniform Semi-Insulating Gallium Nitride Substrate;" and U.S. Provisional Patent Application Ser. No. 60/847,855, filed Sep. 28, 2006, titled "Method of Producing Single Crystal Gallium Nitride Substrates by HVPE Method Incorporating a Polycrystalline Layer for Yield Enhancement," the contents of which are incorporated by reference herein in their entireties.

FEDERALLY SPONSORED RESEARCH

This invention was made with government support under grant number N00164-04-C-6066 by the Missile Defense Agency ("MDA"). The United States Government has certain rights in the invention.

BACKGROUND OF THE INVENTION

1. Field of the Invention

This invention relates to methods for producing gallium nitride (Al, Ga, In)N single crystal substrates that are useful for producing optoelectronic devices (such as light emitting diodes (LEDs), laser diodes (LDs) and photodetectors) and electronic devices (such as high electron mobility transistors (HEMTs)) composed of III-V nitride compounds.

2. Description of the Related Art

Group III-V nitride compounds such as aluminum nitride (AlN), gallium nitride (GaN), indium nitride (InN), and alloys such as AlGaN, InGaN, and AlGaInN, are direct bandgap semiconductors with bandgap energy ranging from about 0.6 eV for InN to about 6.2 eV for AlN. These materials may be employed to produce light emitting devices such as LEDs and LDs in short wavelength in the green, blue and ultraviolet (UV) spectra. Blue and violet laser diodes may be used for reading data from and writing data to high-density optical discs, such as those used by Blu-Ray and HD-DVD systems. By using proper color conversion with phosphors, blue and UV light emitting diodes may be made to emit white light, which may be used for energy efficient solid-state light sources. Alloys with higher bandgaps may be used for UV photodetectors that are insensitive to solar radiation. The material properties of the III-V nitride compounds are also suitable for fabrication of electronic devices that may be operated at higher temperature, or higher power, and higher frequency than conventional devices based on silicon (Si) or gallium arsenide (GaAs).

Most of the III-V nitride devices are grown on foreign substrates such as sapphire ($Al_2O_3$) and silicon carbide (SiC) because of the lack of available low-cost, high-quality, large-area native substrates such as GaN substrates. Blue LEDs are mostly grown on insulating sapphire substrates or conductive silicon carbide substrates. Sapphire belongs to the trigonal symmetry group, while SiC belongs to the hexagonal symmetry group. GaN films and InGaN films have been heteroepitaxially grown on the c-plane sapphire surface for LED devices. Due to lattice mismatch, the GaN films grown on both sapphire and SiC substrates typically have high crystal defects with a dislocation density of $10^9$ to $10^{10}$ cm$^{-3}$. Despite the high defect density of the LEDs grown on these substrates, commercial blue LEDs produced from these materials have long lifetimes suitable for some applications.

UV LEDs based on alloys of GaN, however, show strong dependence of the power output on the substrate material used. The UV LEDs can be grown on native GaN substrate or on foreign substrates such as sapphire and silicon carbide. On the foreign substrate, a GaN or AlGaN thin film is first grown by utilizing appropriate techniques and the active UV LED structure is subsequently grown. It has been found that the power output of UV LEDs grown on native GaN substrate is much greater than the power output of those grown foreign substrates (see, for example, Yasan et al. Applied Physics Letters, Volume 81, pages 2151-2154 (2002); Akita et al. Japanese Journal of Applied Physics, Volume 43, pages 8030-8031 (2004)). The lower density of crystal defect of the device structure grown on native GaN substrate contributes to higher power output.

Group III-V nitride-based laser diodes also show a remarkable dependence of lifetime on the crystal defect density. The lifetime of these LDs dramatically decreases with the increase of the dislocation density (see, for example, "Structural defects related issues of GaN-based laser diodes," S. Tomiya et al., MRS Symposium Proceedings, Vol. 831, p. 3-13, 2005). Low-defect density single-crystal gallium nitride substrates are needed for the long lifetime (>10,000 hours) nitride laser diodes.

Because of the very high equilibrium nitrogen pressure at the melting point, gallium nitride single crystals cannot be grown with conventional crystal growth methods such as the Bridgman method or Czochralski method where single crystals are grown from the stoichiometric melt. At ambient pressure, GaN starts to decompose well before melting.

Hydride vapor phase epitaxy (HVPE) has been utilized to grow relatively thick GaN on foreign substrates. In the HVPE process, gallium chloride (GaCl), formed by reacting gaseous hydrochloric acid (HCl) with gallium metal upstream in the reactor, is transported to the crystal growth region where it reacts with ammonia, depositing GaN on the surface of a substrate. The size of the GaN crystal grown may be the same size as the substrate. Substrates such as sapphire, gallium arsenide, silicon carbide, and other suitable foreign substrates have been used.

Vaudo et al. in U.S. Pat. No. 6,440,823 discloses a method of producing low defect GaN using HVPE on sapphire substrates. The sapphire substrate can be removed to produce a large area GaN substrate, for example, by a laser induced liftoff process as described by Kelly et al. ("Large freestanding GaN substrates by hydride vapor phase epitaxy and laser-induced liftoff," Jpn J. Appl. Phys., Vol. 38, L217-L219, 1999). The wavelength of the laser beam, or the energy of the laser beam, is chosen so that it is smaller than the bandgap of the substrate, but larger than the bandgap of GaN. The substrate is transparent to the laser beam, but the GaN absorbs the laser energy, heating the interface and decomposing the GaN at the interface, which separates the GaN film from the substrate. In U.S. Pat. App. Pub. No. 2002/0068201, Vaudo et al. further discloses a method of producing freestanding GaN near the growth temperature by shining a laser beam at the interface between the grown GaN layer and the template, and decomposing the interface material. This process involves dangerous high-energy laser beams and high manufacturing cost.

Chin Kyo Kim in U.S. Pat. No. 6,923,859 discloses an apparatus and associated manufacturing method for GaN substrates in which a substrate and a GaN layer are separated from each other after growing the GaN layer on the substrate in the same chamber. The apparatus contains a transparent window at the circumference of the chamber to allow the introduction of the laser beam to the substrate. This process likewise involves dangerous high-energy laser beams and has high manufacturing cost.

Bong-Cheol Kim in U.S. Pat. No. 6,750,121 discloses an apparatus and method for forming a single crystalline nitride substrate using hydride vapor phase epitaxy and a laser beam. After growth of the GaN film on sapphire substrate, the wafer is moved to a heated chamber for laser-introduced separation. Because the wafer does not cool to room temperature, cracking induced by the mismatch of the coefficient of thermal expansion is eliminated. This process likewise involves dangerous high-energy laser beams and has high manufacturing cost.

Park et al. in U.S. Pat. No. 6,652,648 discloses a method of producing GaN substrate by first growing HVPE GaN on sapphire substrates. The backside of the sapphire substrate is protected for minimal parasitic deposition. After GaN growth on sapphire substrate, the GaN/sapphire structure is removed from the reactor. The GaN layer is subsequently separated from the sapphire substrate by a laser liftoff process. In addition to involving dangerous high-energy laser beams, the GaN layer on sapphire is likely to crack upon cool down, and thus this process suffers with low yield and high manufacturing cost.

Motoki et al. in U.S. Pat. No. 6,693,021 discloses a method of growing thick GaN film on gallium arsenide (GaAs) substrate. The GaAs substrate is wet-etched away to produce a free-standing GaN substrate. However, GaAs substrates tend to thermally decompose at the GaN growth temperature and in the GaN crystal growth environment, introducing impurities to the GaN film.

Yuri et al. in U.S. Pat. No. 6,274,518 discloses a method for producing a GaN substrate. A first semiconductor film (AlGaN) layer is formed on a sapphire substrate, and a plurality of grooves is formed on the AlGaN layer. A relatively thick GaN film is grown on a grooved AlGaN template by an HVPE method, and upon cooling down from the growth temperature to room temperature, GaN separates from the template, forming a large area freestanding GaN substrate. However, this method requires deposition and patterning of several films in different systems and cracking-separation. Thus, the process is one of low yield and high manufacturing cost.

Solomon in U.S. Pat. No. 6,146,457 discloses a thermal mismatch compensation method to produce a GaN substrate. The GaN film is deposited at a growth temperature on a thermally mismatched foreign substrate to a thickness on the order of the substrate, where the substrate is either coated with a thin interlayer or patterned. After cool down from the growth temperature to the room temperature, it is claimed that thermal mismatch generates defects in the substrate, not in the GaN film, producing a thick high quality GaN material. However, the GaN material of Solomon's invention is still attached to the underlying substrate, with the underlying substrate containing substantial defects and/or cracks. Subsequently, other processing steps are required to create a freestanding GaN layer.

Usui et al. in U.S. Pat. No. 6,924,159 discloses a void assisted method to manufacture GaN substrate. In this method, a first GaN thin film is deposited on a foreign substrate, and a thin metal film such as titanium film is then deposited on the first GaN thin film. The titanium metal film is heated in hydrogen-containing gas to form voids in the first GaN thin film. A thick GaN film is subsequently deposited on the first void-containing GaN film. The voids in the first GaN film create fracture weakness, and upon cooling from the growth temperature to ambient room temperature, the thick GaN layer separates itself from the substrate, forming a GaN wafer. However, this method requires deposition of several layers of films in different systems and cracking-separation. Thus, the process is one of low yield and high manufacturing cost.

The techniques of the prior art for manufacturing GaN wafers are attended by high manufacturing cost. There are some commercial vendors currently selling 2" GaN wafers, but at very high price, reflecting the high manufacturing cost. Additionally, researchers have shown that the freestanding GaN substrates formed using the laser-induced liftoff process can be subject to substantial bowing, which limits their usability for device manufacturing (see, for example, "Growth of thick GaN layers with hydride vapour phase epitaxy," B. Monemar et al., J. Crystal Growth, 281 (2005) 17-31).

In view of such prior-art approaches to forming GaN substrates, it is well-acknowledged that there is still a need in the art for low-cost methods for producing high-quality GaN substrates.

SUMMARY

The present invention generally relates to high-quality gallium nitride (Al, Ga, In)N articles (e.g., crystals, substrates, wafers, etc.) and methods for growing such articles.

According to one implementation, a method is provided for making a GaN article. An epitaxial nitride layer is deposited on a single-crystal substrate to form a nitride-coated substrate. A 3D nucleation GaN layer is grown on the epitaxial nitride layer by HVPE under a substantially 3D growth mode. A GaN transitional layer is grown on the 3D nucleation layer by HVPE under a condition that changes the growth mode from the substantially 3D growth mode to a substantially 2D growth mode. A bulk GaN layer is grown on the transitional layer by HVPE under the substantially 2D growth mode. A polycrystalline GaN layer is grown on the bulk GaN layer to form a GaN/substrate bi-layer. The GaN/substrate bi-layer is cooled from a growth temperature at which the bulk layer is grown to an ambient temperature, wherein GaN material of the bi-layer cracks laterally and separates from the substrate to form a substantially crack-free free-standing GaN article.

According to another implementation, a GaN article is provided, which is produced according to the foregoing method.

According to another implementation, the foregoing method forms a GaN/substrate bi-layer. The GaN/substrate bi-layer is cooled from a growth temperature at which the bulk layer is grown to an ambient temperature, wherein GaN material of the bi-layer cracks laterally and separates from the substrate to form a substantially crack-free free-standing GaN article.

According to another implementation, a free-standing GaN article is provided, which is produced according to the foregoing method.

Other aspects, features and embodiments of the invention will be more fully apparent from the ensuing disclosure and appended claims.

DETAILED DESCRIPTION

Figure 1:
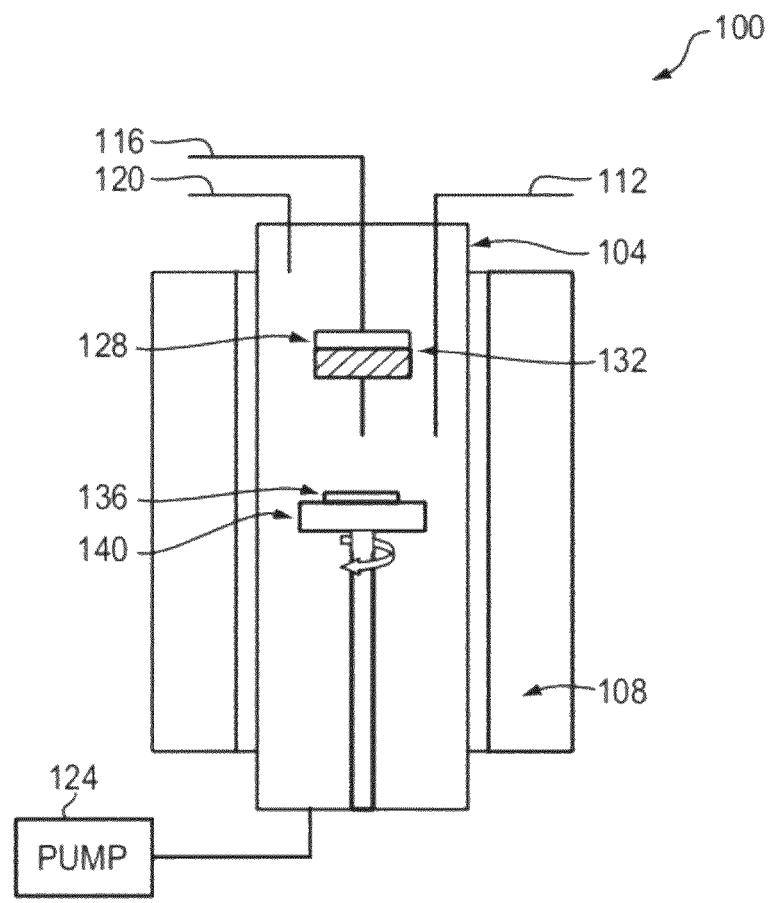
FIG. 1 is a schematic view of a vertical HVPE GaN reactor.

Throughout the disclosure, unless specified otherwise, certain terms are used as follows. "Single crystalline film" or "single crystal" means a crystalline structure that can be characterized with x-ray rocking curve measurement. The narrower the peak of the rocking curve, the better the crystal quality. "Single crystal" does not necessarily mean that the whole crystal is a single grain; it may contain many crystalline grains with orientation more or less aligned. "Polycrystalline film" or "polycrystal" means that a crystal has many grains whose crystal orientations are randomly distributed. An X-ray rocking curve measurement of a polycrystalline film does not exhibit a peak. "Microcracks" are a cluster of localized cracks with high density of cracks. The distance between the parallel cracks in the microcrack cluster is typically less than 100 microns. "Growth cracks" are the cracks formed during crystal growth. "Cool down cracks" or "thermal cracks" are the cracks formed after the crystal growth and during the cooling of the crystal from the growth temperature to ambient or room temperature. "Pits" are typically inverse pyramidal pits on the crystal surface. "Pit-free surface" is a surface essentially having no pits on its surface. "2D growth mode" means that a growth surface remains planar and smooth during the growth. "3D growth mode" means that a growth surface develops non-planar, three-dimensional features such as pits during the growth. "Pitted surface morphology" means a surface having a substantial amount of pits on its surface. Pitted surface morphology is related to the 3D growth mode. "Smooth surface morphology" means that a surface is specular and has no visual defects (such as pits). Smooth surface morphology is related to the 2D growth mode. "Nucleation layer" in some implementations may be the layer first grown on a substrate. In other implementations, a "template layer" may be the layer first grown on a substrate. "Bulk layer" is where the majority of the crystal grown. "V:III ratio" in some implementations is the ratio of the ammonia flow to the HCl flow used during a hydride vapor phase epitaxy GaN growth process. "Ammonia partial pressure" is calculated according to the ammonia flow, the total gas flow into a reactor, and the reactor pressure. "Growth surface" or "growing surface" or "growth front" is the surface of the GaN crystal during the instance of the growth. "Front side" of a GaN substrate is the growth surface side. "Back side" of a GaN substrate is the side opposite to the front side. The c-plane GaN is a polar substrate, with one surface terminated with gallium (Ga-surface or Ga face) and the other surface is terminated with nitrogen (nitrogen-surface or nitrogen face). In this disclosure, the "front-side" of the c-plane single crystal GaN wafer is the Ga-face.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

Unless otherwise indicated, terms such as "gallium nitride" and "GaN" are intended to describe binary, ternary, and quaternary Group III nitride-based compounds such as, for example, gallium nitride, indium nitride, aluminum nitride, aluminum gallium nitride, indium gallium nitride, indium aluminum nitride, and aluminum indium gallium nitride, and alloys, mixtures, or combinations of the foregoing, with or without added dopants, impurities or trace components, as well as all possible crystalline structures and morphologies, and any derivatives or modified compositions of the foregoing. Unless otherwise indicated, no limitation is placed on the stoichiometries of these compounds.

Single-crystal GaN films can be grown on sapphire substrates with various vapor phase growth techniques, such as molecular beam epitaxy (MBE), metal-organic vapor phase epitaxy (MOVPE), and hydride vapor phase epitaxy (HVPE). In the MBE and MOVPE growth of GaN films on sapphire, a low-temperature buffer layer is typically needed to grow high-quality GaN film. It is not clear whether a buffer layer is needed for HVPE GaN growth on sapphire. Lee in U.S. Pat. No. 6,528,394 discloses a specific method of pre-treatment for growing GaN on sapphire using HVPE. The pre-treatment involves etching sapphire with a gas mixture of hydrochloric acid (HCl) and ammonia ($NH_3$), as well as nitridation of the sapphire substrate. Molnar in U.S. Pat. No. 6,086,673 discloses the use of zinc oxide (ZnO) pretreatment layer that was further reacted in the gaseous environment of HCl and/or $NH_3$. After this treatment of the sapphire substrate, single-crystal GaN film is then grown by HVPE. On the other hand, Vaudo et al. in U.S. Pat. No. 6,440,823 discloses the growth of a low defect density GaN layer on sapphire by an HVPE method, without using any buffer layers or nucleation layers.

Since teachings in the prior art regarding sapphire substrate treatment or initiation prior to HVPE GaN growth are in conflict, we systematically investigated the growth of gallium nitride film on sapphire using an HVPE process. Vertical HVPE reactors were used for the investigation. FIG. 1 schematically illustrates an example of a vertical HVPE reactor 100. The HVPE reactor 100 includes a quartz reactor tube 104 that is heated by a multi-zone furnace 108. The reactor tube 104 is connected to gas inlets 112, 116, and 120 for introducing reactants, carrier gases, and diluting gases. The reactor tube 104 is also connected to a pump and exhaust system 124. In some implementations, inside the reactor 100, gaseous hydrochloric acid (HCl) is flowed through a vessel 128 containing gallium metal 132, which is at a temperature of, for example, about 850° C. The hydrochloric acid reacts with the gallium metal 132, forming gaseous GaCl, which is transported by a carrier gas, such as nitrogen, to the deposition zone in the reactor tube 104. Ammonia ($NH_3$) and an inert diluent gas, such as nitrogen, are also flowed to the deposition zone where GaN crystals are deposited. The reactor 100 is designed such that the mixing of GaCl and $NH_3$ does not occur near the gas outlets, ensuring no deposition of GaN on the outlets of GaCl and $NH_3$ and enabling long-term stability of gas flow patterns. Epi-ready c-plane sapphire substrates or other suitable substrates 136 may be used. The sapphire substrate 136 is placed on a rotating platter 140, and heated to a temperature of, for example, 900-1100° C.

A typical deposition run process is as follows: (1) a sapphire substrate 136 is placed on the platter 140, (2) the reactor 100 is sealed, (3) the reactor 100 is evacuated and purged with high-purity nitrogen to remove any impurities from the system, (4) the platter 140 with the substrate 136 is raised to the deposition zone, (5) the platter temperature is controlled at the desired deposition temperature, (6) ammonia is flowed into the reactor 100, (7) HCl is flowed to the reactor 100 to start the GaN deposition, (8) deposition proceeds according to a predetermined recipe for a predetermined time, (9) the HCl and $NH_3$ gas flows are stopped, (10) the platter 140 is lowered and the grown crystal is gradually cooled down, and (11) the grown crystal is removed for characterization and further processing.

After systematically investigating the HVPE growth of GaN on sapphire substrates, we uncovered several issues that were not disclosed in the prior art, namely, irreproducible nucleation of single crystal GaN film on untreated sapphire substrates, and microcracking of single crystalline GaN films.

GaN Nucleation on Sapphire

First, we grew various HVPE GaN films directly on sapphire substrates without any buffer layer or pretreatment under the conditions taught by the prior art, i.e., a growth temperature of about 950-1050° C., a V:III ratio (i.e., $NH_3$/HCl) of about 10-50, and a growth rate of about 100 microns per hour. The bare sapphire substrate was heated up to the growth temperature, ammonia flow was turned on first to fill the reactor to a pre-determined partial pressure, and HCl flow was turned on to initiate the growth. The GaN film grown directly on the bare sapphire substrate was not smooth. After analyzing the grown GaN films with x-ray rocking curve and optical microscope, we determined that the GaN films grown directly on bare sapphire substrates were not single crystalline films. In fact, they were polycrystalline GaN. We wish not to be bound by any particular theory regarding the various results of HVPE GaN crystal growth on sapphire, but the discrepancy in the various prior-art work and our own work may be related to particular reactor configurations or surface treatments. The prior art did not teach a reproducible method to grow single crystal GaN films on sapphire substrates by HVPE.

There is a large lattice mismatch between sapphire and gallium nitride. Furthermore, c-plane GaN is a polar crystal, i.e., one face is terminated with gallium and the opposite face of the crystal is terminated with nitrogen. On the other hand, sapphire is not a polar crystal; the c-plane of sapphire is terminated with oxygen on both faces. In other GaN thin-film deposition techniques such as molecular beam epitaxy (MBE) or metal-organic vapor phase epitaxy (MOVPE), a thin buffer layer is required for high-quality single-crystalline GaN growth. The buffer layer may be an AlN layer (S. Yoshida et al., Appl. Phys. Lett., 42, 427 (1983); H. Amano et al., Appl. Phys. Lett., 48, 353 (1986)) or a GaN layer grown at low temperature (S. Nakamura, Jpn. J. Appl. Phys., 30, L1705 (1991)). Lee in U.S. Pat. No. 6,528,394 postulated formation of a thin AlN layer on the sapphire surface by the pre-treatment step prior to HVPE GaN growth.

U.S. Pat. No. 6,784,085, which is incorporated by reference herein in its entirety, discloses a high-temperature reactive sputtering method for growing high-quality AlN film on sapphire substrates. Using this method, we coated sapphire substrates with AlN for use as substrates for HVPE GaN growth.

Figure 2:
FIG. 2 is an optical micrograph of the surface of a GaN film grown on an AlN-coated sapphire substrate. The GaN film thickness was about 1 micron.

High-quality GaN thin films were successfully and reproducibly grown on the AlN-coated sapphire substrate. We first grew a thin layer of AlN film on a sapphire substrate by sputtering using the method disclosed in U.S. Pat. No. 6,784,085. The thickness of the AlN layer was about 0.05-2 microns. X-ray rocking curve measurement indicated the AlN film was epitaxial single-crystalline film with (0002) rocking curve full width at half maximum (FWHM) of 50 arcsec. The AlN-coated sapphire substrate was loaded into the HVPE reactor and a GaN film was grown using the aforementioned procedure. The growth rate was about 60 microns per hour, the GaCl partial pressure was about 2.97 Torr, the $NH_3$ partial pressure was about 44.6 Torr, the V:III ratio was about 15, and the growth temperature was about 950° C. as measured with a thermocouple under the platter. The growth time was 1 minute. The GaN film grown was transparent with a smooth specular surface. FIG. 2 shows an optical micrograph of the surface of the GaN film. FIG. 2 shows a typical smooth surface morphology for an HVPE GaN film with some hillock features. X-ray rocking curve measurements confirm the single-crystalline nature of the GaN film, with a FWHM value of 297 arcsec.

GaN Film Microcracking

Figure 3:
FIG. 3 is an optical micrograph of a GaN film, about 5 microns thick, grown on an AlN-coated sapphire substrate using the HVPE technique. Microcracking of the film is visible.

After developing the nucleation of a GaN single-crystalline film on an AlN sputter-coated sapphire substrate, we investigated the growth of thicker GaN films. We discovered a problem, namely, microcracking in the GaN films. The HVPE growth conditions were chosen to produce a smooth GaN surface. FIG. 3 shows an optical micrograph of thin GaN film, about 5 microns thick on an AlN-coated sapphire substrate, grown under the same conditions as the film shown in FIG. 2. The surface exhibits a typical smooth HVPE GaN morphology with hillock features. However, microcracks in the GaN film are apparent. The sapphire substrate remains intact without any cracking in this case.

Because of the difference between the coefficients of thermal expansion of the sapphire substrate and the GaN film, thermal stress builds up when the film cools down from the typical growth temperature of about 1000° C. to ambient room temperature. As discussed in open literature (for example, E. V. Etzkorn and D. R. Clarke, "Cracking of GaN Films," J. Appl. Phys., 89 (2001) 1025), sapphire substrate shrinks faster than GaN film during cool down, causing a compressive stress in the GaN film due to this thermal expansion mismatch. The compressive thermal stress in the GaN film should not cause microcracking in the GaN film during cool down. Therefore, the microcracks must be already formed during the GaN growth and prior to cool down.

The microcracking of the GaN film during the growth suggests a tensile stress in the GaN film during the growth. We wish not to be bound by any particular theory regarding the origin of microcracking during GaN growth. However, the tensile stress may be related to the AlN layer employed in the study, or may be related to the HVPE growth condition used, or may be universal to the HVPE GaN growth in general. While cracking is noted in some instances, most prior-art teachings in HVPE GaN growth do not disclose the formation of microcracks in GaN film during growth. The prior art also does not teach how to eliminate the microcracks during the HVPE GaN growth.

In order to eliminate the microcracks formed during the HVPE GaN growth, we systematically investigated GaN growth on the AlN-coated sapphire under various growth conditions by varying growth parameters, such as GaCl flow or partial pressure (which may be determined by the flow of hydrochloric acid (HCl)), $NH_3$ flow or partial pressure, growth temperature, and associated variables such as growth rate and V:III ratio (e.g., $NH_3$/HCl ratio). In this example, the V:III ratio is the ratio of the $NH_3$/HCl flow. The growth rate is typically proportional to GaCl partial pressure, which is directly related to the HCl flow. We found that the surface morphology varies substantially with the growth temperature, growth rate and ammonia partial pressure (or V:III ratio). At a constant growth temperature and GaCl partial pressure, increasing $NH_3$ partial pressure dramatically alters behavior of microcracking and surface morphology. For a constant growth time (similar film thickness, about 100 microns), the HVPE GaN surface morphology gradually changes from a smooth, hillocked morphology with microcracks at low $NH_3$ partial pressure, to a surface covered with pits at moderately high $NH_3$ partial pressure, and eventually to polycrystalline material at high $NH_3$ partial pressure. When the GaN film is covered with pits, the microcracks are not formed at all.

Figure 4:
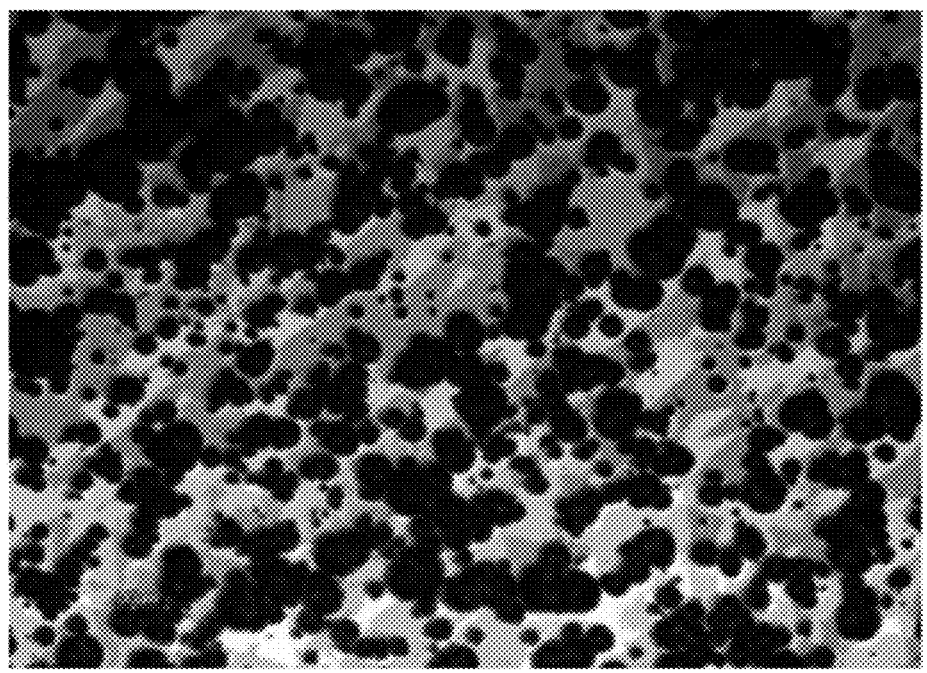
FIG. 4 is an optical micrograph of a pitted GaN film, about 110 microns thick, grown on AlN-coated sapphire substrate under moderate $NH_3$ partial pressure (V:III ratio).

FIG. 4 is a micrograph of a GaN surface grown under moderately high $NH_3$ partial pressure (moderate V:III ratio). This particular GaN film was grown on an AlN-coated sapphire substrate. The growth rate was about 320 microns per hour, the GaCl partial pressure was around 1.8 Torr, the $NH_3$ partial pressure was around 112.8 Torr, the V:III ratio was around 58, and the growth temperature was about 990° C. The growth time was 20 minutes. Although the GaN film surface is covered with pits, the film is still epitaxial single-crystalline film, as confirmed by x-ray rocking curve measurement, with FWHM of 400 arcsec. The larger FWHM value of the film is due in part to curvature of the sample, which is known to broaden the X-ray diffraction peak.

Similar surface morphology trends are observed with growth temperature at otherwise constant conditions, or with growth rate at otherwise constant conditions. Under constant GaCl and $NH_3$ partial pressures (constant growth rate and V:III ratio), reducing the growth temperature alters the growth morphology from a smooth, hillocked structure to a pitted surface morphology and eventually to polycrystalline growth. Similarly, at a constant growth temperature and V:III ratio, increasing the growth rate (by increasing both GaCl and $NH_3$ partial pressure) alters the surface morphology from a smooth pit-free surface to a pitted surface and eventually to a polycrystalline morphology.

Figure 5:
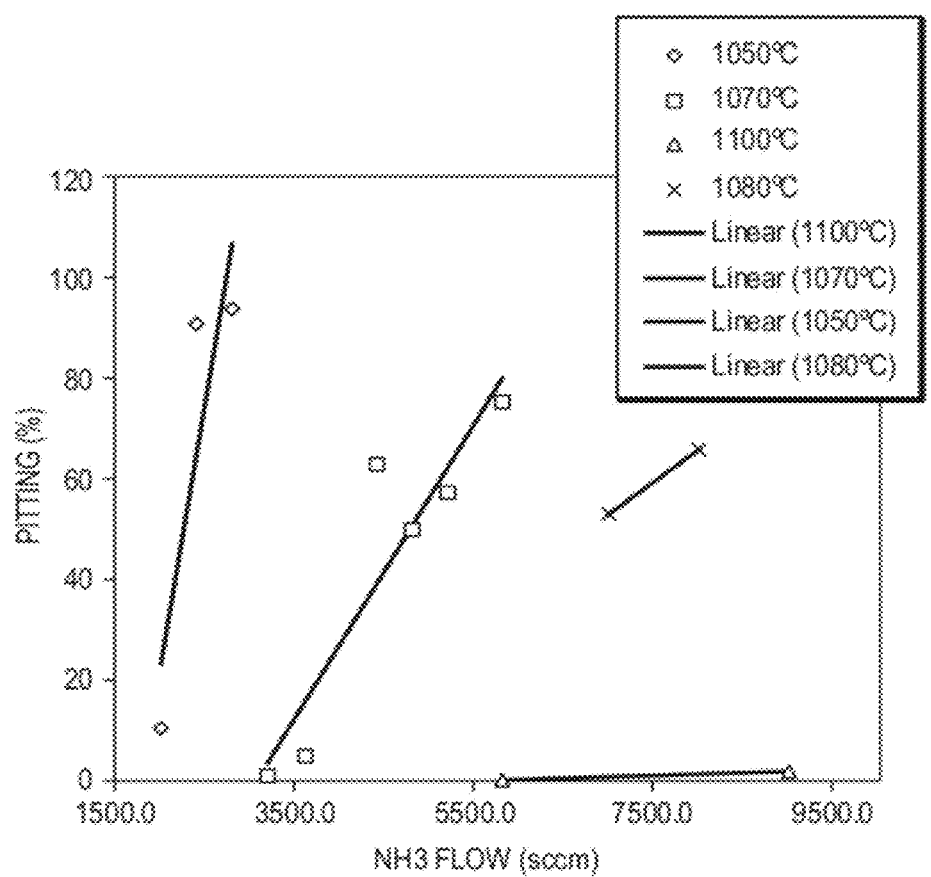
FIG. 5 illustrates plots of the pitting percentage, defined as the percentage of area covered with pits on GaN film, versus $NH_3$ flow, for furnace temperatures between 1050° C. and 1100° C. The growth rate was about 300 microns per hour and the film thickness was about 100 microns.

Since the pitted surface morphology eliminates the microcracks in the GaN film during the growth, we extensively studied the growth conditions that could yield pitted morphology. Furthermore we defined a pitting percentage as the percentage of the surface area covered with pits. Typically for a 100-micron thick GaN film grown under constant conditions on an AlN-coated sapphire substrate, a pitting percentage greater than 30% in the GaN film eliminates the growth microcracks. We evaluated pitting percentage as a function of growth $NH_3$ partial pressure for several growth temperatures. FIG. 5 illustrates pitting percentage for 100-micron thick GaN films grown on AlN-coated sapphire substrates versus the $NH_3$ flow for furnace temperatures ranging from 1050° C. to 1100° C. The growth rate for this study was about 300 microns per hour and the film thickness was about 100 microns. At lower growth temperature, a slight change in $NH_3$ partial pressure leads to a large change in pitting percentage, whereas at higher growth temperature, a change in $NH_3$ partial pressure leads to a lesser change in pitting percentage. This indicates that growth morphology is more sensitive to the $NH_3$ partial pressure at lower temperature than at higher growth temperature.

Thermal Stress and Cracking of GaN Grown on Sapphire

After discovering that HVPE GaN grown under conditions that yield pitted surface morphology eliminates the microcracks in GaN during the growth, we encountered another problem: cracking of GaN and sapphire when the wafer cooled down from the growth temperature to the ambient room temperature due to the mismatch in the coefficients of thermal expansion.

Figure 6:
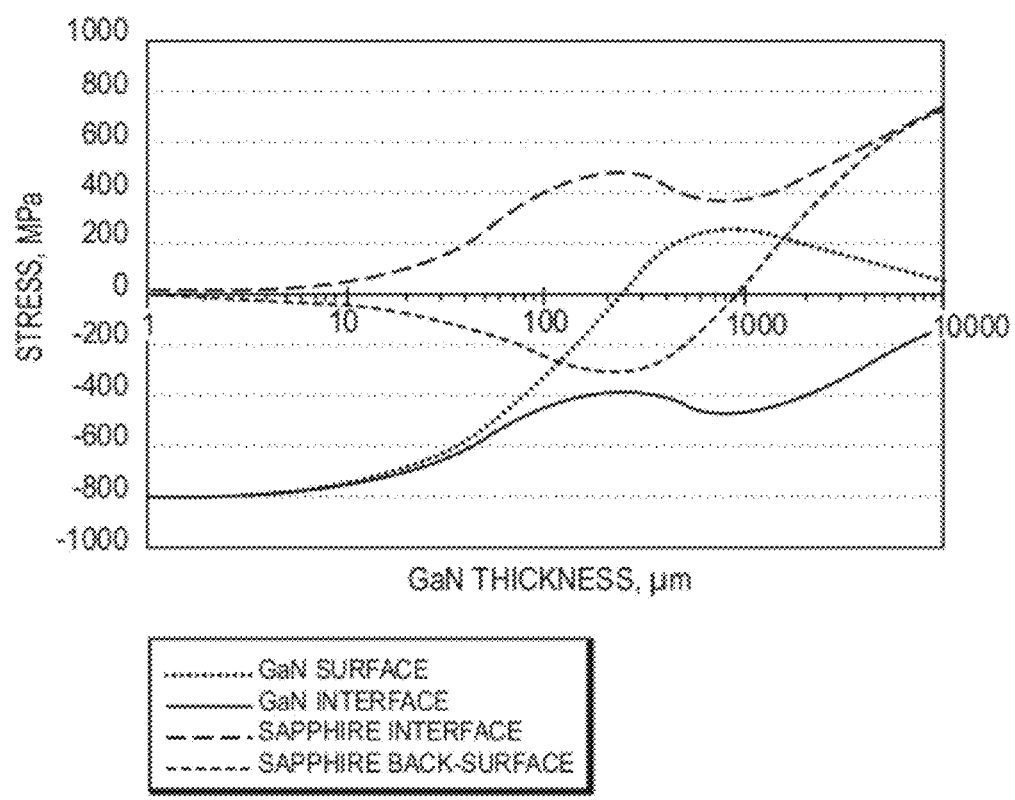
FIG. 6 illustrates plots of the calculated in-plane biaxial stresses in GaN and sapphire for a simple two-layer stress model as a function of GaN layer thickness. Positive stress values are tensile and negative stress values are compressive. The thickness of the sapphire is 430 μm and the growth temperature is taken to be 970° C.

A sapphire substrate has a larger coefficient of thermal expansion (CTE) than a gallium nitride thin or thick film. During cooling down from a growth temperature of, for example, about 1000° C. to room temperature, sapphire shrinks faster than the gallium nitride film. In a simple two-layer model, sapphire near the interface is under biaxial tensile stress and the GaN film near the interface is under biaxial compressive stress in the plane parallel to the interface. It is noted that the gallium nitride at the interface is always under biaxial compressive stress, whereas the stress on the gallium nitride surface depends on the thickness of the gallium nitride film (for a given sapphire substrate thickness). The stress on the gallium nitride surface is changed from compressive stress to tensile stress with increased gallium nitride film thickness. The calculated thermal stresses in GaN and sapphire for a simple two-layer model as a function of GaN layer thickness are shown in FIG. 6.

The thermal stress results in high strain energy in the GaN/sapphire bi-layer structure. The strain energy may be released by cracking. Cracking occurs, in general, if the strain is above the critical strain and energy is released by cracking. For example, when the GaN film is quite thin and sapphire is thick, the GaN/sapphire bilayer does not crack after cooling because the GaN is under compressive stress and sapphire is under tensile stress, which is still below the critical stress. When both the GaN layer and sapphire substrate are relatively thick, sapphire cracks under the tensile stress, which can propagate into the GaN film, causing GaN cracking as well.

There are four main possible types of cracking when considering the GaN/sapphire bilayer structure: cracks perpendicular to the surface and cracks parallel to the surface; and cracks in the GaN and sapphire. Cracks perpendicular to the surface break the wafer. Cracks in the GaN layer parallel to the surface (lateral cracks) can separate GaN from the sapphire substrate. Sometimes both types of crack are present, which can result in small pieces of freestanding GaN.

Methods for Producing GaN Wafer by Self-Separation

U.S. Provisional Patent Application Ser. No. 60/750,982, filed Dec. 16, 2005, titled "METHOD OF PRODUCING FREESTANDING GALLIUM NITRIDE BY SELF-SEPARATION", which is incorporated by reference herein in its entirety, discloses a method for making large-area freestanding GaN substrates. According to this method, a thick GaN/substrate bi-layer is produced in a growth sequence comprising several growth conditions. The growth steps include depositing an epitaxial nitride layer on the substrate, growing a thin GaN layer on the nitride-coated substrate under a 3D growth mode that results in a surface covered with pits, growing a transitional GaN layer on the 3D growth layer to recover from a heavily pitted surface morphology to a less pitted surface morphology, and growing a bulk growth layer on the recovery layer. The resulting GaN/substrate bi-layer is then cooled from the growth temperature to room temperature whereby the GaN layer cracks laterally and separates from the underlying substrate by itself during cooling from the growth temperature down to room temperature.

The GaN growth method according to this example will now be described with reference to FIG. 7, which schematically illustrates a GaN crystal structure 700, and FIG. 8, which schematically illustrates a GaN crystal/substrate bi-layer 800 after self-separation.

Figure 7:
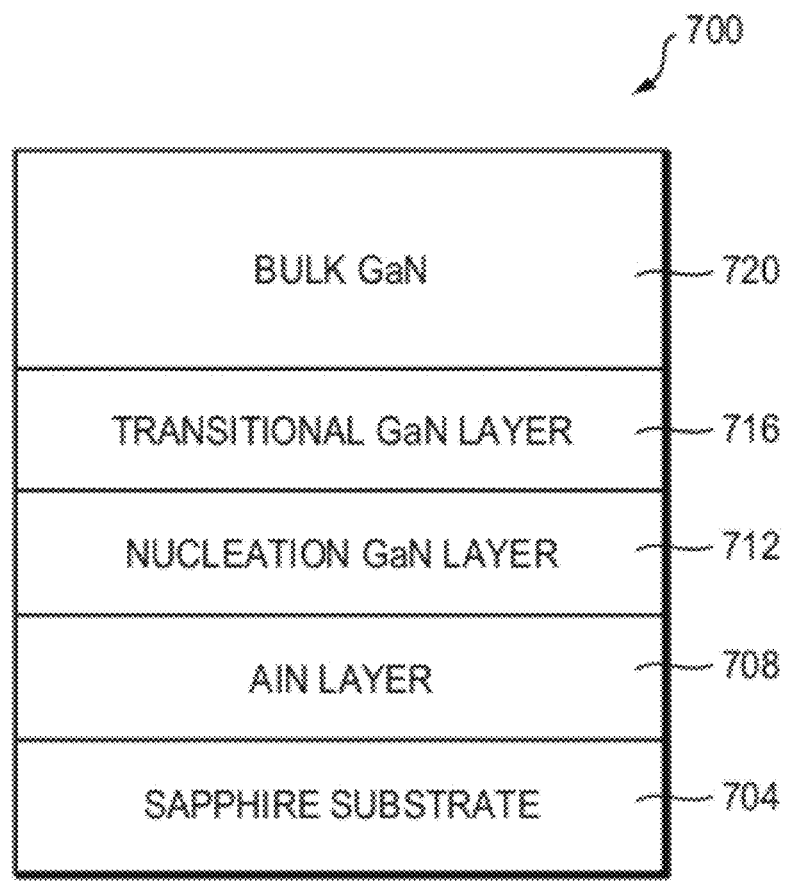
FIG. 7 is a schematic view of a GaN crystal structure that includes a bulk GaN crystal grown on a substrate, showing different layers of the crystal structure.

Referring to FIG. 7, a suitable substrate 704 is provided. In some implementations, the substrate 704 may have a characteristic dimension (e.g., diameter) of about 2 inches or greater. As further examples, the diameter of the substrate 704 may be about 3" or greater, about 4" or greater, or any other suitable size such as about 12" or greater. The substrate 704 may be sapphire ($Al_2O_3$), although other suitable single-crystal substrates 704 may be utilized. Non-limiting examples of suitable substrates 704 include sapphire, silicon carbide, gallium arsenide, zinc oxide, silicon, spinel, lithium gallate, lithium aluminate, etc.

The first step of the growth process is to deposit a thin epitaxial nitride layer 708 on the substrate 704. The purpose of this epitaxial nitride layer 708 is to provide a template for epitaxial growth of GaN. The epitaxial nitride layer 708 in one embodiment is prepared by high-temperature reactive sputtering in a sputtering chamber. The epitaxial nitride layer 708 may also be formed by molecular beam epitaxy (MBE), metal-organic vapor phase epitaxy (MOVPE or MOCVD), hydride vapor phase epitaxy, or high-temperature annealing of the substrate 704 in ammonia. In one example, the thickness of the epitaxial nitride layer 708 is in the range (ranges) from about 0.05 to about 10 microns. In another example, the thickness of the epitaxial nitride layer 708 ranges from about 0.2 to about 2 microns. Other types of template layers may be used, for example, a GaN or AlGaN layer, grown by MOVPE, MBE or HVPE.

The second step of the growth process is to grow a nucleation GaN layer 712 by hydride vapor phase epitaxy in a 3D growth mode with a growth condition that yields a pitted surface morphology. The growth condition for this layer 712 is typically higher growth rate, and/or higher ammonia flow (or V:III ratio), and/or lower growth temperature than the "optimal" thin-film growth condition. The "optimal" thin-film growth condition is one that would produce smooth, substantially pit-free, crack-free thin films (e.g., with a thickness less than 3 microns), but would produce microcracked thick films (e.g., with a thickness equal to or greater than 20 microns). As one specific example of an optimized growth condition, a 1-micron thick GaN film that is transparent and has a smooth specular surface has been grown on an AlN-coated sapphire substrate by the inventors. The growth rate was about 60 microns per hour, the GaCl partial pressure was about 3 Torr, the $NH_3$ partial pressure was about 45 Torr, the V:III ratio was about 15, the growth temperature was about 950° C., and the growth time was one minute. When growing a thin film ($\leq 3$ μm), this "optimal" thin-film growth condition typically produces a crack-free film, whereas when growing a thick film ($\geq 20$ μm), the "optimal" growth condition typically produces a microcracked film.

There are two purposes for this pitted growth layer 712: first is to prevent microcracking of GaN during the growth, and second is to create in the GaN film a certain stress condition that will facilitate the lateral cracks during cool down. In one example, the thickness of the 3D growth layer 712 may range from about 5 to about 500 microns. In another example, the thickness of the 3D growth layer 712 may range from about 5 to about 200 microns. In another example, the thickness of the 3D growth layer 712 may range from about 5 to about 100 microns. In another example, the thickness of the growth layer 712 ranges from about 10 to about 50 microns. In yet another example, the thickness of the 3D growth layer 712 ranges from about 20 microns to about 30 microns. In another example, the thickness of the 3D growth layer 712 is about 20 microns.

The third step of the growth process is to change the growth conditions to recover the surface morphology from a highly pitted surface morphology to a less pitted surface morphology, which prepares the surface of the growing crystal for the subsequent bulk growth stage where most of the GaN crystal is grown. In this third step, the growth mode is gradually changed from a 3D growth mode to a 2D growth mode. This transition is accomplished by growing a recovery layer 716 on the 3D growth layer 712 under conditions such as lower growth rate, and/or lower ammonia partial pressure, and/or higher growth temperature than the growth condition of the 3D nucleation layer 712. In one example, the thickness of the morphology recovery layer 716 may range from about 5 to about 100 microns. In another example, the thickness of the recovery layer 716 ranges from about 5 to about 50 microns. In another example, the thickness of the recovery layer 716 is about 8 microns. The purposes of the recovery layer 716 are to prevent the GaN film from turning into polycrystalline, and to obtain a film stress state that facilitates lateral cracks during cool down.

The fourth growth step is the bulk growth step where the bulk of the GaN film is grown. As illustrated in FIG. 7, a bulk layer or crystal 720 is grown on the recovery layer 716. The growth condition is chosen so that the morphology of the GaN film is slightly pitted or pit-free. The GaN growth mode in this step is substantially a 2D growth mode. The growth conditions may be held constant during this step. Alternatively, the growth condition may be slightly ramped, for example, slightly ramping down ammonia flow, slightly ramping down the growth rate or slightly ramping up the temperature. The purpose of the ramping in the bulk growth step is to further reduce the density of the pits on the growing GaN surface. During the bulk growth step, the density of the pits on the growing GaN surface is gradually reduced. At the end of the bulk growth, the GaN surface is slightly pitted or pit-free. In one example, the thickness of the GaN bulk layer 720 grown in the bulk growth step ranges from about 500 to about 2000 microns (0.5 to 2 mm). In another example, the thickness of the GaN bulk layer 720 ranges from about 1000 to about 1500 microns (1 to 1.5 mm). In some implementations, the crystal growth process is performed to yield a single wafer. In other implementations, the process may be performed to grow a GaN boule that can be sliced into multiple wafers, in which case a thicker bulk layer 720 may be grown, for example, about 2 mm or greater, from about 2 mm to about 10 mm, or about 10 mm or greater.

After completing the growth, the resulting thick GaN-on-substrate bi-layer is gradually cooled down. In one example, the cooling rate is less than about 20° C. per minute, whereas in another example it is less than about 10° C. per minute. In another example, the rate of cooling is about 6° C. per minute. During this cool down time, lateral cracking occurs in the GaN film with the crack plane substantially or essentially parallel to the GaN/substrate interface, leading to the separation of GaN from the underlying substrate.

Figure 8:
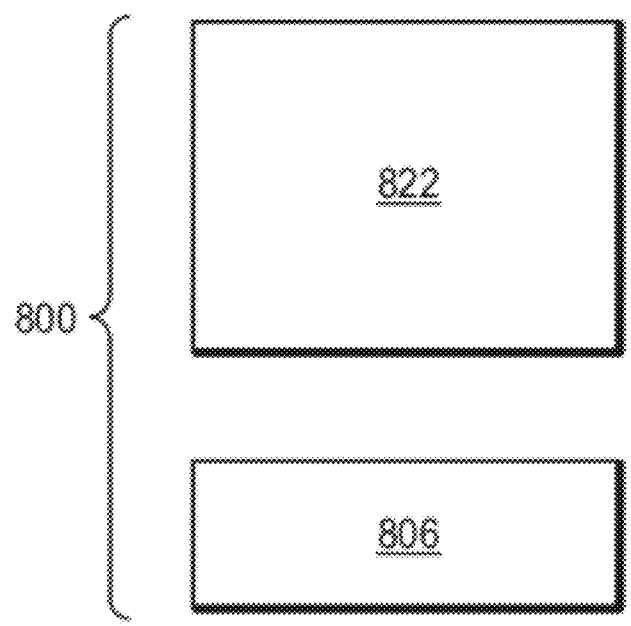
FIG. 8 is a schematic view of the GaN crystal structure illustrated in FIG. 7 after self-separation, yielding a free-standing GaN crystal separate from the underlying substrate.

FIG. 8 illustrates the resulting separated GaN/substrate bi-layer structure 800. A thick GaN wafer 822 having a characteristic dimension (e.g., diameter) as large as the initial substrate 704 (FIG. 7) may be obtained, along with the substrate 806 covered with a thin layer of GaN. As examples, when a 2" substrate 704 is utilized, a 2" GaN wafer 822 may be obtained. When a 3" substrate 704 is utilized, a 3" GaN wafer 822 may be obtained. The substrate 806 may remain intact, or remain partially intact with edge fracture, or fracture into several pieces. The remaining GaN on the substrate 806 is typically less than 500 microns thick. The thickness of the freestanding GaN wafer 822 typically ranges from about 0.5 mm to about 10 mm.

After self-separation, the GaN wafers may be mechanically polished to a specified wafer thickness. To remove the subsurface damage, the wafer may be chemically mechanically polished as the last step. Reactive ion etching or inductively coupled plasma etching may also be used to remove the damaged surface layer. Other suitable surface finishing techniques may alternately or additionally be employed.

When implementing this method, the lateral cracks occur in the GaN/substrate bi-layer structure 800 because it is the most effective way to relieve the thermal stress. We wish not to be bound by any particular theory regarding how the lateral cracks occur, but here we present a possible mechanism by which lateral cracking in the bi-layer structure 800 may occur. Since a substrate material such as sapphire shrinks more than GaN during cool down, the thermal stress condition of the GaN/substrate bi-layer structure 800 results in the substrate being under tensile stress whereas the GaN near the interface is under the compressive stress. Film fracture behavior under compressive stress has been reported in the open literature (see, for example, "Fracture in Thin Films," S. Zuo, *Encyclopedia of Materials: Science and Technology*, Elsevier Science, 2001) and may be used to describe the GaN/substrate system. In accordance with the present method, when a film is under compression, it can self-separate, or debond, from the underlying substrate.

In general, fracture is driven by the relaxation of residual stresses, in this case, thermal stress due to expansion mismatch. Fracture will occur if the driving force exceeds the fracture resistance for the particular fracture mechanism. Cracks can form at pre-existing flaws in the film, in the substrate, or at areas where the resolved stress is concentrated and exceeds the critical fracture value. The mechanics and process of the fracture processes are not fully understood, but under biaxial compressive stress, the in-plane lattice constants a and b of the GaN film are shortened whereas the lattice constant c is elongated. The increased lattice constant c under the biaxial stress weakens the bond strength causing the separation in the c direction, i.e., lateral cracking. This stress may be increased locally by geometric factors.

In the present case, the structure of the as-grown GaN layer(s) leads to conditions conducive to compressive debonding at or near the interface between the GaN and substrate. The epitaxial nitride (e.g., AlN) layer, the first GaN nucleation step, the second GaN nucleation step, or some combination of the three, results in the initiation of the debonding behavior during cool down. Experimentally, the initial debonding has been observed to occur near the center of the substrate bi-layer. After debonding, buckling occurs as the self-separated area increases. As the elastic constants of the GaN and the substrate (e.g., sapphire) are close in magnitude and plastic deformation is extremely small, the degree of buckling is limited. After buckling, both normal and shear stresses develop that will continue to grow the debonded area like a crack. Under preferred conditions, the debonding continues to the edge of the GaN/substrate bi-layer and separates the GaN layer from the substrate.

There are three major competing processes that have also been observed for the relief of the thermal stress in the GaN/substrate bi-layer: (1) lateral cracking in the GaN layer due to compressive stress in the GaN layer near the GaN/substrate interface, to form a whole piece of thick stress-free GaN wafer and a thinner-GaN/substrate bi-layer, (2) vertical cracks in sapphire due to tensile stress developed during cool down (the vertical cracks may also propagate to GaN), and (3) the presence of both lateral cracking in GaN and vertical cracking in substrate and GaN. A crack will occur in the direction where the stress exceeds the critical stress.

In addition to the thermal stress during cool down, the GaN/substrate bi-layer also experiences a growth stress built up during the crystal growth. The growth stress can lead to GaN microcracks under certain growth conditions as discussed in the previous paragraphs. The growth stress can also lead to the breaking of the substrate and the GaN layer during the growth, which is observed under non-optimal growth conditions.

The growth sequence employed prepares in the GaN layer a certain stress state during the growth, such as increased compressive stress in the GaN layer near the interface or reduced tensile stress on the substrate, enabling the compressive stress debonding during cool down while preventing growth stress leading to microcracking or vertical cracking in the substrate or GaN layer, yielding a freestanding GaN substrate. The formation of the 3D nucleation layer is one key aspect for the separation of the bulk GaN layer during cool down. If the first nucleation layer is grown under conditions of 2D growth, the most likely mechanism for thermal stress relief for the thick GaN/substrate bi-layer is vertical cracking in the substrate that propagates to the GaN layer.

Methods for Producing GaN Articles with the Use of a Polycrystalline Layer

In some cases, the above-described method for making a freestanding substrate may suffer a drawback; namely, GaN may also break during the separation, reducing the yield of the process.

According to the present disclosure, the method of GaN substrate production disclosed in above-described U.S. Prov. Pat. App. Ser. No. 60/750,982 may be further improved by introducing a mechanically stronger polycrystalline layer to cap the single-crystalline GaN layer, thus improving the yield of the process.

Figure 9:
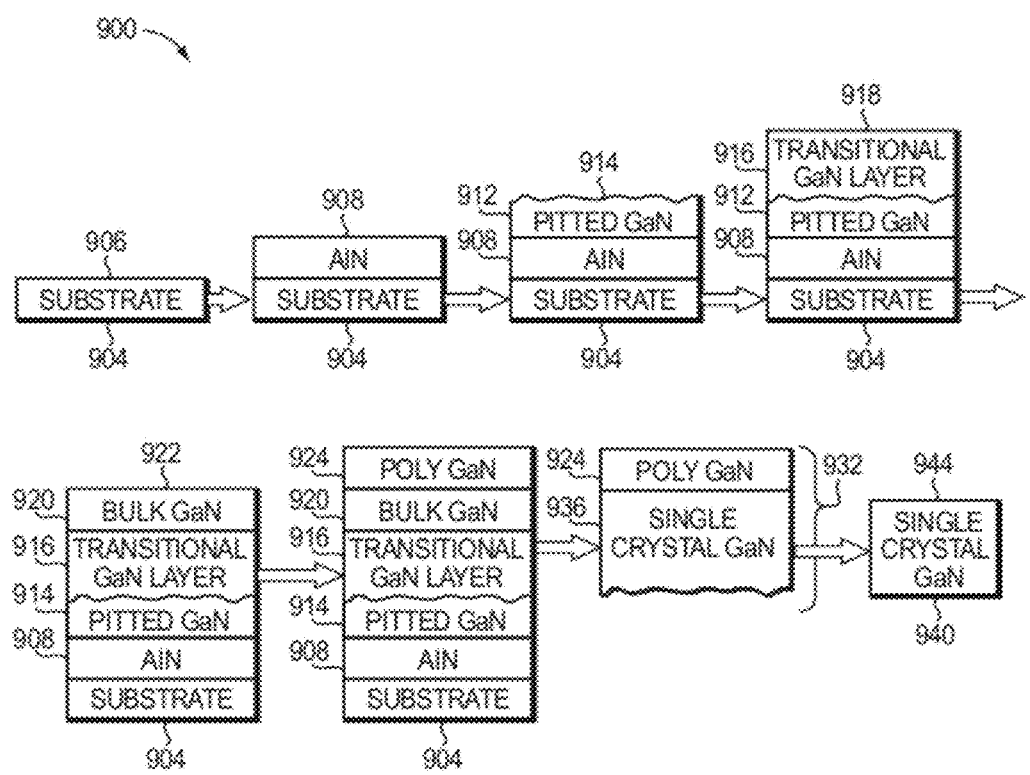
FIG. 9 is a schematic illustration of a method for producing a single crystal GaN wafer according to an implementation of the present invention.

FIG. 9 is a schematic, sequential illustration of an example of a process 900 of the present invention. First, a sapphire substrate 904 is provided. An epitaxial nitride (e.g., AlN) layer 908 is then deposited on a surface 906 of the sapphire substrate 904. The deposition of epitaxial nitride layer 908 may be done in the same reactor as for the subsequent GaN growth, or in a different deposition chamber. GaN material is subsequently deposited on the nitride-coated substrate 904/908 by hydride vapor phase epitaxy in multiple steps with different growth conditions for each step. A first GaN layer 912 is grown under a condition that results in a pitted surface morphology, and such conditions are characterized by relatively higher growth rate, and/or high ammonia flow, and/or lower growth temperature than the optimal thin-film growth conditions that would yield a smooth surface morphology. The first GaN layer 912 thus has a pitted surface 914. A second GaN layer 916 is grown from the first GaN layer 912. The second GaN layer 916 functions as a transitional layer that is grown under a condition that gradually fills the pits and yields a much less pitted GaN surface 918, and such growth conditions are characterized by relatively lower growth rate, and/or lower ammonia flow, and/or higher growth temperature than the first pitted growth step. A third GaN layer 920 is then grown on the second GaN layer 916. The third GaN layer 920 is the bulk layer where the majority of single-crystal GaN is grown. A fourth GaN layer 924 is then grown on the third GaN layer 920. The fourth GaN layer 924 is a polycrystalline GaN layer that is provided to increase the overall mechanical strength of the entire GaN layers.

During cooling down from the growth temperature to ambient room temperature, the grown GaN film separates from the sapphire substrate 904 via lateral cracking, producing a free-standing crack-free GaN article 932 that includes a single-crystal layer 936 and the polycrystalline layer 924. The polycrystalline GaN material 924 is mechanically stronger than the single-crystal layer 936 and reduces the breakage of the GaN article 932. The freestanding crack-free GaN article 932 is processed by removing the polycrystalline GaN layer 924 to yield a single crystal GaN wafer 940.

Continuing with the example illustrated in FIG. 9, in some implementations, the substrate 904 may have a characteristic dimension (e.g., diameter) of about 2 inches or greater. As further examples, the diameter of the substrate 904 may be about 3" or greater, about 4" or greater, or any other suitable size such as about 12" or greater. The substrate 904 may be sapphire ($Al_2O_3$), although other suitable single-crystal substrates 904 may be utilized.

The surface 906 of the substrate 904 may be exactly c-plane or vicinal surfaces of the c-plane. Vicinal surfaces may promote step-flow during the HVPE GaN growth and may yield smoother surface morphology. The offcut angle of the vicinal surface with respect to the c-plane is in one example between about 0.1° and about 10°, and in another example between about 0.5° and about 5°. The direction of offcut may be along the <1-100> direction or along the <11-20> direction, or along a direction between <1-100> and <11-20>.

In one implementation, the epitaxial nitride layer 908 is deposited by reactive sputtering on a heated substrate in a sputter deposition chamber. The nitride-coated substrate 904/908 is subsequently removed from the sputter chamber and loaded into the HVPE reactor for GaN growth. Other nitride nucleation layers such as, for example, AlN grown by MOCVD or MBE, GaN grown by MOCVD or MBE, AlGaN grown by MOCVD or MBE, or the like may also be used. In some implementations, a reactive sputtering-deposited AlN layer has an advantage of lower cost than MOCVD- or MBE-deposited nitride layers. AlN layers may also be grown in the HVPE reactor by incorporating an Al source so that hydrochloric acid reacts with Al to form aluminum chloride, which reacts with ammonia in the deposition zone to form AlN on the substrate surface. In one example, the thickness of the epitaxial nitride layer 908 is in the range (ranges) from about 0.05 to about 10 microns. In another example, the thickness of the epitaxial nitride layer 908 ranges from about 0.5 to about 2 microns. In another example, the thickness of the epitaxial nitride layer 908 ranges from about 0.5 to about 2 microns.

In some implementations, depending on such factors as process conditions and the specific reactor being employed, the deposition of the epitaxial nitride layer 908 may be desirable for growing single-crystal GaN films on sapphire substrates using the HVPE process. In other HVPE reactor systems, however, the single-crystalline GaN layer 912 may be grown directly on the substrate 904 by HVPE without using a template layer such as the epitaxial nitride layer 908 prior to HVPE growth. In such cases, the growth sequence according to the teaching of the present invention can skip the nitride-coating step and proceed directly to the next growth step.

Figure 10:
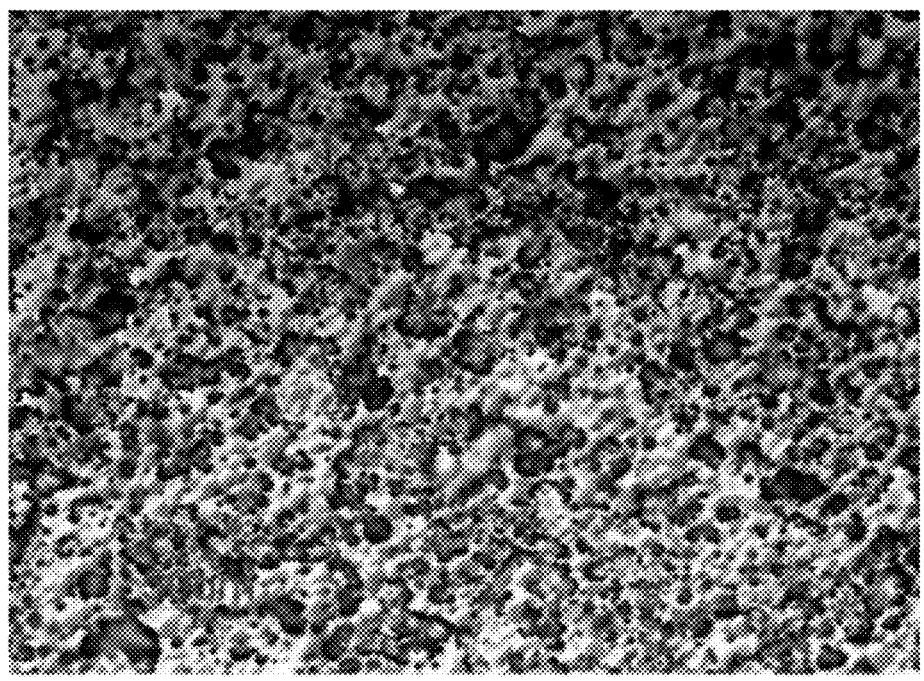
FIG. 10 is an optical micrograph of a GaN film according to an implementation of the present invention.

The second step of the growth process is to grow an epitaxial GaN layer 912 by hydride vapor phase epitaxy in a 3D growth mode. The uncoated substrate 904 or nitride-coated substrate 904/908 is loaded into an HVPE reactor, and the reactor may be purged with high-purity nitrogen to remove impurities. An epitaxial layer 912 of gallium nitride is then grown. This GaN layer 912 is grown in a three-dimensional (3D) growth mode, where the surface 914 of the film is very rough and covered with pits. If the growth is stopped at the end of the first step and wafer taken out of the reactor, the GaN surface 914 is not specular, as shown in a microphotograph in FIG. 10. The GaN film at this stage is still single-crystalline film as demonstrated by x-ray rocking curve measurements. The pit coverage, defined as the percentage of the surface covered with the pits on the surface, is in one example greater than about 50%, and in another example greater than about 75% at the end of this step. In other examples, the pitting percentage is greater than about 90%. The growth condition for this layer 912 is typically higher growth rate, and/or higher ammonia flow (V:III ratio), and/or lower growth temperature than the "optimal" thin-film growth condition. An example of an "optimal growth condition" is an HVPE GaN growth condition that would yield a pit-free GaN thin film (e.g., $\leq 3$ μm) on an AlN-coated sapphire substrate.

There are two purposes for this 3D growth layer 912: first is to prevent microcracking of GaN during the growth, and second is to present the GaN film with a certain stress condition that will facilitate the lateral cracks during cool down. In one example, the thickness of the 3D growth layer 912 may range from about 5 to about 100 microns. In another example, the thickness of the growth layer 912 ranges from about 10 to about 50 microns. In yet another example, the thickness of the 3D growth layer 912 ranges from about 20 microns to about 30 microns. In another example, the thickness of the 3D growth layer 912 is about 20 microns.

In one implementation, the growth temperature in the 3D growth mode ranges from about 900° C. to about 1000° C., the V:III ratio in the 3D growth mode ranges from about 10 to about 100, and the growth rate in the 3D growth mode ranges from about 50 μm/hr to about 500 μm/hr.

If the GaN film is grown under the 3D growth mode with higher thickness, the GaN film quality is gradually changed from an epitaxial single-crystalline film to a polycrystalline film.

The third step of the growth process is to change the HVPE growth conditions to transition the surface morphology from a heavily pitted surface morphology to a gradually less pitted surface morphology. The transition layer 916 is grown under conditions such as lower growth rate, and/or lower $NH_3$ flow, and/or higher growth temperature than the growth condition of the nucleation layer 912. In one example, the thickness of this morphology transition layer 916 ranges from about 5 to about 500 microns. In another example, the thickness of the transition layer 916 ranges from about 5 to about 200 microns. In another example, the thickness of the transition layer 916 ranges from about 5 to about 100 microns. In another example, the thickness of the transition layer 916 ranges from about 5 to about 50 microns. In another example, the thickness of the transition layer 916 is about 8 microns. The purposes of the transition layer 916 are to prevent the GaN film from turning into polycrystalline, and to prepare in the film a stress state that facilitates lateral cracks during cool down. At the end of growth of the transitional layer 916, the growth surface 918 is substantially pit-free. The surface coverage of pits at the growth surface 918 after growing the transitional layer 916 is in one example less than about 10%, in another example less than about 5%, and in another example less than about 1%.

In one implementation, the growth temperature in the recovery layer growth mode ranges from about 920° C. to about 1100° C., the V:III ratio in the recovery layer growth mode ranges from about 8 to about 80, and the growth rate in the recovery layer growth mode ranges from about 50 μm/hr to about 500 μm/hr.

The fourth growth step is the bulk growth step where the bulk of the single crystalline GaN film is grown. The growth condition is chosen so that the morphology of the GaN film remains slightly pitted or pit-free. The GaN growth mode in this step is substantially a 2D growth mode. The growth conditions may be held constant during this step. Alternatively, one or more growth conditions may be slightly ramped, for example, slightly ramping down ammonia flow or slightly ramping down the growth rate or slightly ramping up the temperature. The purpose of the ramping in the bulk growth step is to further reduce the density of the pits on the growing GaN surface. During the bulk growth step, the density of the pits on the growing GaN surface is gradually reducing. At the end of the bulk growth, the GaN surface 922 is slightly pitted or pit-free. In one example, the thickness of the GaN bulk layer 920 grown in the bulk growth step ranges from about 500 to about 2000 microns (about 0.5 to about 2 mm). In another example, the thickness of the GaN bulk layer 920 ranges from about 1000 to about 1500 microns (about 1 to about 1.5 mm).

In one implementation, the growth temperature in the bulk growth stage ranges from about 950° C. to about 1100° C., the V:III ratio in the bulk growth stage ranges from about 5 to about 50, and the growth rate in the bulk growth stage ranges from about 50 μm/hr to about 500 μm/hr.

The fifth step is to grow a polycrystalline GaN film 924 on top of the single-crystalline GaN film 920 grown in the fourth step by changing the growth condition. The polycrystalline GaN film 924 may be grown by reducing the growth temperature, and/or increasing the $NH_3$ flow, and/or increasing the growth rate, as compared with the growth conditions employed in the preceding bulk growth step. In one example, the thickness of the polycrystalline GaN film 924 ranges from about 500 to about 2000 microns (0.5 to 2 mm).

In one implementation, the growth temperature in the polycrystalline growth stage ranges from about 850° C. to about 1000° C., the V:III ratio in the bulk growth stage ranges from about 20 to about 200, and the growth rate in the bulk growth stage ranges from about 100 μm/hr to about 500 μm/hr.

The polycrystalline layer 924 is postulated herein to improve the integrity of the GaN article 932 in the following manners. In a single crystal, the cleavage planes of the crystal are substantially aligned and when a crack forms, there is little to blunt the crack from progressing through the thickness or length of the crystal. When a polycrystalline layer 924 is deposited on the single crystal, the crystal cleavage planes in the polycrystal are not aligned with the planes in the single crystal. If a crack were to propagate through the single crystal, the energy required to propagate the crack through the polycrystal increases, thus making the article stronger. Additionally, when a polycrystalline layer 924 is deposited on top of the single crystal, the thickness of the crystal changes and the stress in the entire GaN layer due to thermal expansion mismatch is reduced. This reduces the likelihood of crack formation in the article.

After completing the growth, the thick GaN-on-substrate bi-layer is gradually cooled down. The cooling rate is in one example less than about 20° C. per minute, and in another example less than about 10° C. per minute. In another example, the rate of cooling is about 6° C. per minute. During this cool down time, lateral cracking occurs in the GaN film with the crack plane essentially parallel to the GaN/substrate interface, leading to the separation of GaN from the underlying substrate. A thick GaN article 932 having a characteristic dimension (e.g., diameter) as large as the initial substrate 904 may be obtained, along with the substrate covered with a thin layer of GaN. As examples, when a 2" substrate 904 is utilized, a 2" GaN article 932 may be obtained. When a 3" substrate 904 is utilized, a 3" GaN article 932 may be obtained. When a 4" substrate 904 is utilized, a 4" GaN article 932 may be obtained. The substrate 904 may remain intact, or remain partially intact with edge fracture, or fracture into several pieces. The remaining GaN on the substrate 904 is typically less than 500 microns thick. The resulting freestanding GaN article 932 is typically 1-4 mm thick.

The freestanding GaN article 932 may be processed into a single-crystalline GaN wafer or substrate 940 by mechanical means such as grinding or lapping and polishing. In one example, the freestanding GaN article 932 is first sized into a desired wafer shape (herein defined as a wafer blank), optionally with major and minor flats to indicate the crystal orientation of the substrate 940. In one example, the sized GaN wafer blank is about 10 mm×10 mm square or greater—i.e., the sized GaN wafer blank includes a side having a length of about 10 mm or greater. In another example, the sized GaN wafer blank is about 18 mm×18 mm square. In another example, the sized GaN wafer blank is about 1 inch round or greater—i.e., the sized GaN wafer blank is circular and has a diameter of about 1 inch or greater. In another example, the sized GaN wafer blank is about 2 inches round or greater. The front of the wafer blank is the polycrystalline GaN and the back of the wafer blank is the nitrogen-face of the single-crystalline GaN. The polycrystalline part of the wafer blank may be removed by mechanical means such as grinding and/or lapping. The thickness removed from the front side of the wafer blank may be at least as much as or greater than the thickness of the polycrystalline material to expose the Ga-face 944 of the single crystalline GaN substrate 940. After completely removing the polycrystalline material from the front side of the wafer blank, the front side (Ga face) may be further polished with diamond slurry. The Ga-surface 944 may be finished with a chemical-mechanical polish step that removes the surface and subsurface damage and produces an epi-ready surface. The back side of the wafer blank may be processed by mechanical means such as grinding or lapping to planarize (mechanically flatten) the surface and to achieve the desired wafer thickness. Since the crystal defect density is reduced during the growth of single-crystalline GaN, it may be preferable to take away material from the back side to achieve the desired wafer thickness. Optionally, the back side may be polished to produce an optical finish.

In some implementations, during the bulk growth, no impurity is introduced and all the gas sources are purified, in order to achieve high-purity GaN crystals. In some examples, the impurity concentration in the high-purity GaN layer is less than about $10^{17}$ cm$^{-3}$. In other examples, the impurity concentration is less than about $10^{16}$ cm$^{-3}$. In other examples, the impurity concentration is less than about $10^{15}$ cm$^{-3}$.

Alternatively, in other implementations, during the bulk growth, n-type impurities, such as silicon (introduced, for example, as diluted silane) or oxygen, are introduced to produce n-type GaN crystals. The introduction of impurities may occur at any stage of the GaN growth. In some examples, the electron concentration in the n-type bulk GaN layer is greater than about $10^{17}$ cm$^{-3}$. In other examples, the electron concentration is greater than about $10^{18}$ cm$^{-3}$. In other examples, the electron concentration is greater than about $10^{19}$ cm$^{-3}$. In some examples, the resistivity of the n-type GaN layer is less than about 0.1 ohm-cm. In other examples, the resistivity is less than about 0.01 ohm-cm. In other examples, the resistivity is less than about 0.001 ohm-cm. Conductive GaN wafers may be used as substrates for the fabrication of optoelectronic devices such as light emitting diodes, laser diodes, and photodetectors. Conductive GaN wafers may also be used as substrates for electronic devices such as Schottky diodes and heterojunction bipolar transistors.

In other implementations, during the bulk growth, p-type impurities such as magnesium (Mg) are introduced to produce p-type GaN crystals. Mg may be introduced as metal-organic compound or as metal vapor. The introduction of impurities may occur at any stage of the growth. In some examples, the hole concentration in the p-type bulk GaN layer is greater than about $10^{17}$ cm$^{-3}$. In other examples, the hole concentration is greater than about $10^{18}$ cm$^{-3}$. In other examples, the hole concentration is greater than about $10^{19}$ cm$^{-3}$. In some examples, the resistivity of the p-type GaN layer is less than about 0.1 ohm-cm. In other examples, the resistivity is less than about 0.01 ohm-cm. In other examples, the resistivity is less than about 0.001 ohm-cm.

In other implementations, the electrical properties of the bulk GaN crystal can also be made semi-insulating by introducing a deep-level acceptor. Transition metals, such as iron, are deep level acceptors. Iron can be introduced to the deposition zone either via a metal-organic compound such as ferrocene or via iron chloride formed by reacting iron with hydrochloric acid. The concentration of the transition metal in the bulk GaN layer may range from about $10^{16}$ to about $10^{20}$ cm$^{-3}$. In other examples, the concentration of the transition metal ranges from about $10^{17}$ to about $10^{19}$. In other examples, the concentration of the transition metal is around $10^{18}$ cm$^{-3}$. The resistivity of the SI bulk GaN layer at room temperature may be greater than about $10^{6}$ ohm-cm. In other examples, the resistivity is greater than about $10^{7}$ ohm-cm. In other examples, the resistivity is greater than about $10^{8}$ ohm-cm. Semi-insulating GaN wafers can be used as substrates for electronic devices such as high electron mobility transistors.

Certain implementations of the present invention may be further understood by the following illustrative, non-limiting examples.

EXAMPLE 1

Si-doped GaN Growth

In this example, we illustrate production of silicon-doped 2" single crystalline GaN wafer. A 2" c-plane sapphire was used as the starting substrate. An epitaxial AlN layer was deposited using high temperature reactive sputtering method, as disclosed in U.S. Pat. No. 6,704,085. The thickness of the AlN layer was approximately 0.25 μm. X-ray rocking curve measurement showed a full width at half maximum of about 55 arcsec for the AlN(0002) reflection, indicating high crystal quality of the AlN film. The AlN-coated sapphire substrate was loaded into the previously described vertical HVPE system and the GaN growth was commenced.

Figure 11:
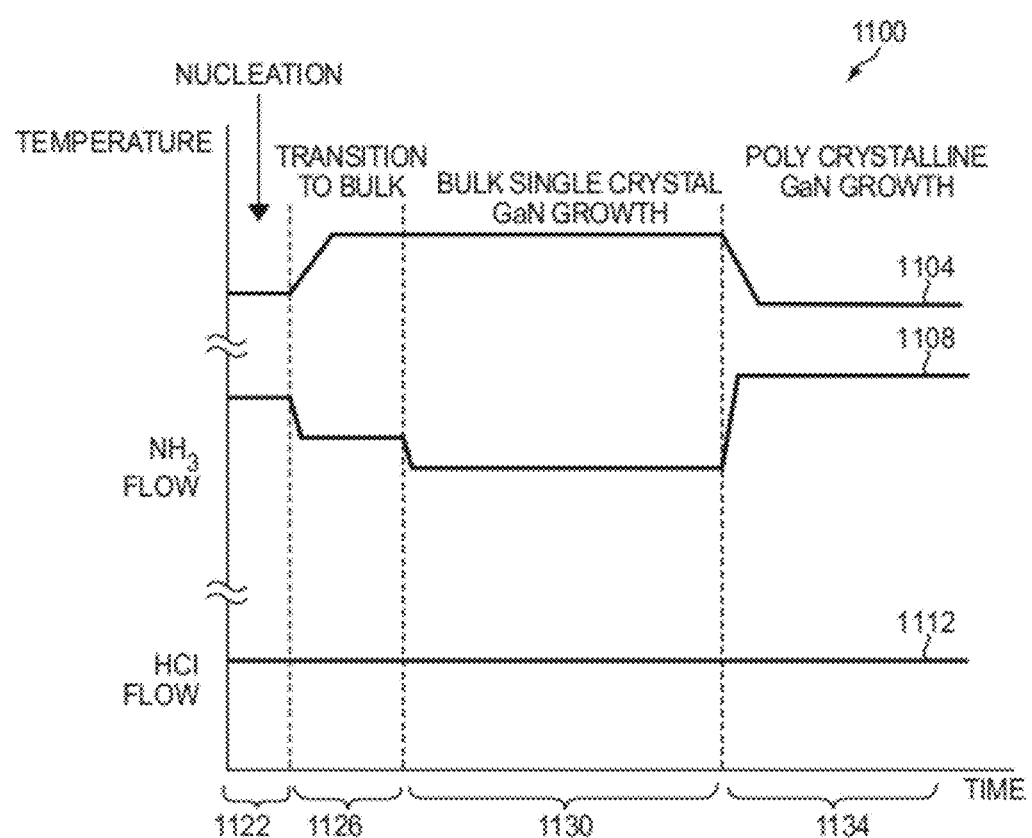
FIG. 11 is an illustration of a GaN growth process, including the temperature, $NH_3$ flows, and HCl flows for the nucleation, transition, bulk growth, and polycrystalline growth stages according to one example of the present invention.

FIG. 11 is an illustration of the HVPE GaN growth process 1100 for this example, including the temperature 1104, NH$_3$ flows 1108, and HCl flows 1112 for the nucleation stage 1122, transition stage 1126, bulk growth stage 1130, and polycrystalline growth stage 1134. The growth process included a nucleation step 1122 on the AlN-coated sapphire substrate with a rough surface morphology (3D growth mode), transitioning 1126 the growth condition from the nucleation stage (3D growth mode) 1122 to the single-crystalline bulk growth stage (2D growth mode) 1130, single-crystalline bulk growth stage 1130, and polycrystalline cap growth 1134.

The nucleation layer was grown at a growth temperature of about 995° C., HCl flow of about 120 sccm, and NH$_3$ flow of about 4000 sccm, corresponding to a growth rate of about 330 μm/hr. The growth time was about 5 minutes, corresponding to a thickness of about 28 μm. In some examples, the growth was stopped at this stage and the wafer was taken out for examination. The GaN surface was very rough and not specular. Under optical microscope examination, the surface contains high density of pits, similar to the image shown in FIG. 10.

Figure 12:
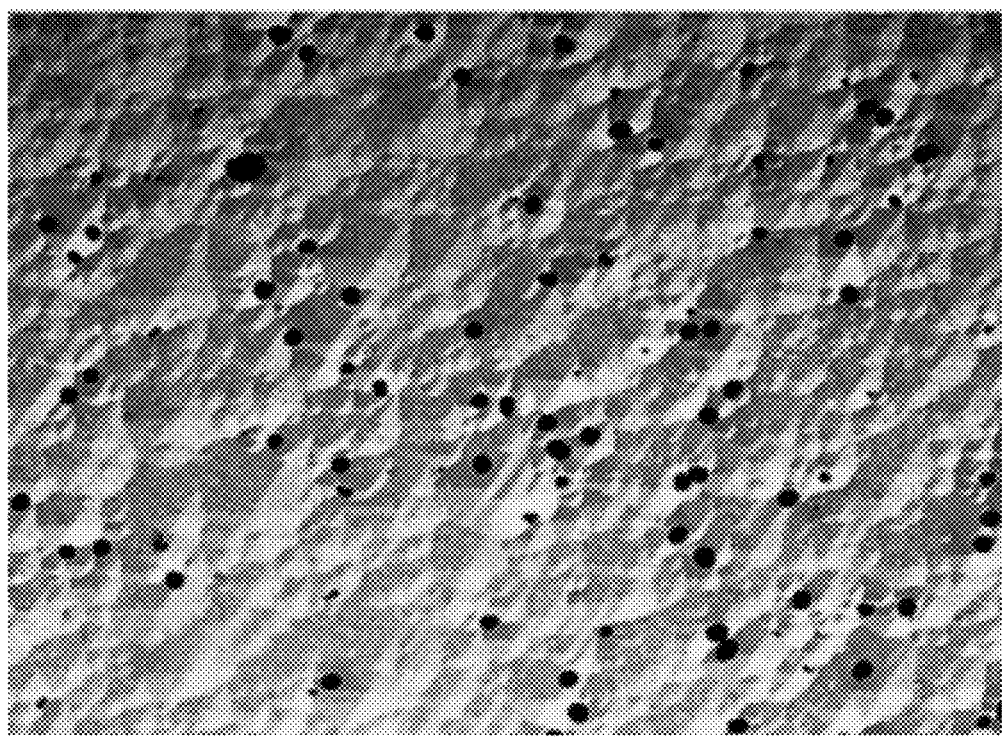
FIG. 12 is an optical micrograph of a GaN film according to an implementation of the present invention.

After the growth of the 3D nucleation layer, the growth condition was changed to influence the evolution of the surface morphology from a heavily pitted surface to a much less pitted surface. The growth temperature was raised by about 15° C. to about. 1010° C., NH$_3$ flow was reduced from about 4000 sccm to about 2000 sccm. The growth rate was remained at 330 μm/hr and the growth time was 30 minutes, corresponding to a nominal thickness of about 165 μm for the transitional layer. Silane was introduced into the reactor during the growth. In some examples, the growth was stopped at this stage, and the wafer was taken out of the reactor for examination. The GaN surface was visually specular. When examined under optical microscope, the GaN surface exhibited typical hillock morphology with some pits. FIG. 12 shows an optical micrograph of the GaN film grown at this stage. The surface area occupied by the pits was quite low, typically less than 5%.

Following the transition layer, the single crystalline bulk GaN layer was grown. The growth temperature and the growth rate remained the same as those for the transitional layer, 1010° C. and 330 μm/hr. The NH$_3$ flow was further reduced from 2000 sccm to 1600 sccm for this stage of the growth. The silane flow was not changed. The growth time for this step was 3.5 hours, corresponding to a nominal thickness of about 1.1 mm for the material grown in this step. The total epitaxial single-crystalline GaN film grown was about 1.35 mm thick. In some examples, the growth was stopped at this stage, and the wafer was taken out of the reactor for examination. The surface morphology was similar to that shown in FIG. 12, except that the hillock feature is larger and surface is almost pit-free. Under these growth conditions, the GaN cracked laterally during cool down and separated the GaN from the sapphire (the sapphire still has a thin GaN layer). Because the GaN also has a few cracks from the fracture during cool-down, frequently only large pieces of freestanding GaN and not the whole 2" substrate were obtained.

After the growth of the bulk single crystalline GaN layer, the growth condition was changed to grow a mechanically stronger polycrystalline GaN cap. The growth temperature was reduced by 20° C. to 990° C. and the $NH_3$ flow was increased from 1600 sccm to 6000 sccm. The HCl flow was kept at 120 sccm for a nominal growth rate of 330 μm/hr. At this growth condition, the GaN film gradually changed into a polycrystalline film during the growth. In this example, the growth time for the polycrystalline cap was about 4 hours and the nominal thickness of the polycrystalline GaN material was about 1.3 mm. The total GaN thickness was about 2.6 mm.

After completion of the growth sequence, the GaN/sapphire bi-layer was cooled to room temperature at a cooling rate of approximately 6° C. per minute. During the cooling process, the GaN cracked laterally, forming a 2" freestanding GaN article and the sapphire substrate with a thin GaN layer still attached. Because of the presence of the mechanically stronger polycrystalline GaN layer, the GaN article did not crack vertically during the laterally cracking separation. The freestanding 2" GaN article was crack-free. The thickness of the freestanding GaN article was about 2.1 mm.

The top surface of the freestanding GaN was polycrystalline material and the bottom surface was the nitrogen face (N-face) of the single crystalline GaN. The bottom surface was not flat because it was generated from lateral cracking.

The 2" freestanding GaN article was processed into 2" GaN wafer. First, edge grinding was performed to make into within 0.005" tolerance of the 2" wafer diameter. Because the initial sapphire had a major flat, the grown GaN article also had a flat. The ground 2" GaN article is called a wafer blank herein.

The 2" GaN wafer blank was mounted on a fixture using wax with the front surface facing the fixture. The back surface (N-face) was lapped on a metal plate with diamond slurry until a uniform surface finish was achieved. At this stage, the thickness of the blank was about 1.8 mm. The 2" GaN wafer blank was removed from the fixture and mounted again using wax with the back side facing the fixture. The front side was lapped on a metal plate with diamond slurry. About 1.3 mm of the front material was removed. At this stage, the polycrystalline material was completely removed, resulting in a 2" single crystalline GaN wafer about 500 micron thick. Because silicon doping was used during the growth, the GaN wafer was conductive with a resistivity less than 0.05 ohm-cm.

EXAMPLE 2

Semi-insulating GaN Growth

In this example, we illustrate production of semi-insulating 2" GaN substrate. Sapphire(0001) was used as the starting substrate. An AlN layer approximately 0.25 μm thick was grown on the sapphire substrate using reactive sputtering on the heated substrate. X-ray diffraction was used to verify the AlN film was single crystal with a full width at half maximum of 55 arcsec. The AlN/sapphire structure was loaded into the previously described vertical HVPE system and the GaN growth was commenced.

Figure 13:
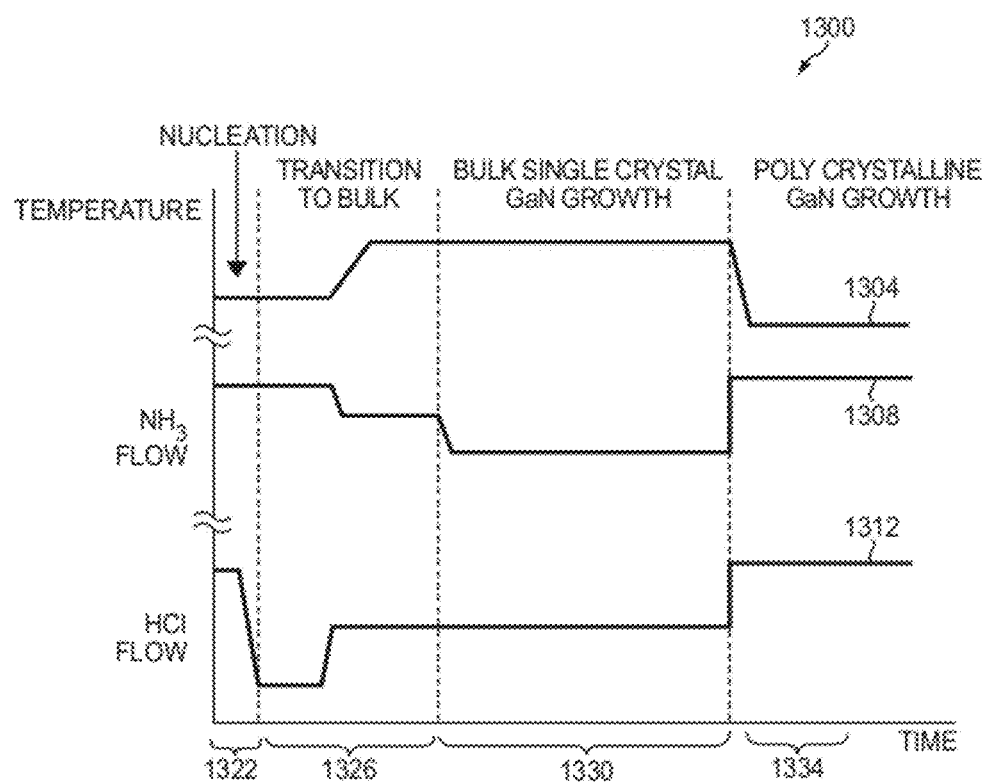
FIG. 13 is an illustration of a GaN growth process, including the temperature, $NH_3$ flows, and HCl flows for the nucleation, transition, bulk growth, and polycrystalline growth stages according to another example of the present invention.

The HVPE GaN film was grown by a multiple-step method. FIG. 13 is an illustration of the HVPE GaN growth process 1300 for this example, including the temperature 1304, $NH_3$ flows 1308, and HCl flows 1312 for the nucleation stage 1322, transition stage 1326, bulk growth stage 1330, and polycrystalline growth stage 1334. The growth process 1300 included a nucleation step 1322 on the AlN-coated sapphire substrate with a rough surface morphology (3D growth mode), transitioning 1326 the growth condition from the nucleation stage (3D growth mode 1322) to the single-crystalline bulk growth stage (2D growth mode) 1330, single-crystalline bulk growth 1330, and polycrystalline cap growth 1334.

The GaN film was first grown under conditions of growth rate of approximately 260 microns per hour, growth temperature of 968° C., HCl flow rate of 92 sccm, and $NH_3$ flow rate of 2000 sccm. This was the GaN nucleation layer on the AlN-coated surface. The growth time for the nucleation layer was approximately 4 minutes and the thickness of this layer was approximately 18 microns. In some runs, the growth was stopped at this point, and the wafer was taken out of the reactor for examination. The wafer surface was visually not specular, and appeared rough. Under microscope examination, the surface was covered with high density of pits. This layer was grown under a 3D growth mode.

After growth of the nucleation layer, the growth rate was reduced to approximately 65 microns per hour by reducing HCl flow to 23 sccm while keeping the same $NH_3$ and growth temperature. After growth of approximately 7 minutes under these conditions, the HCl flow was increased to 46 sccm, the $NH_3$ flow was reduced to 1500 sccm and growth temperature was raised by 15° C. to 983° C. for approximately 1 hour. These two growth conditions were considered as the transitional layer where the surface morphology was improved with less pits. Ferrocene was introduced in the growth system using a nitrogen carrier gas flow of 200 sccm. In some runs, the growth was stopped at this point and wafer was taken out of the reactor for examination. The wafer surface was visually specular and smooth. A few pits still remained, but the percentage of the surface covered by pits was less than 1%. In this step the growth mode was transitioned from the 3D mode of the nucleation to 2D growth mode.

After the growth of the transitional layer, the $NH_3$ flow was further reduced to 900 sccm for additional growth time of 7 hours. The ferrocene flow was maintained during this layer.

After the growth of the bulk single crystalline GaN layer, the growth condition was changed to grow a mechanically stronger polycrystalline GaN cap. The growth temperature was reduced by 20° C. to 963° C. and the $NH_3$ flow was increased from 900 sccm to 5000 sccm. The HCl flow increased to 120 sccm for a nominal growth rate of 330 μm/hr. At this growth condition, the GaN film gradually changed into polycrystalline during the growth. In this example, the growth time for the polycrystalline cap was about 4 hours and the nominal thickness of the polycrystalline GaN material was about 1.3 mm. The total GaN thickness was about 2.6 mm.

After completion of the growth sequence, the GaN/sapphire bi-layer was cooled to room temperature at a cooling rate of approximately 6° C. per minute. During the cooling process, the GaN cracked laterally, forming a 2" freestanding GaN article and the sapphire substrate with a thin GaN layer still attached. Because of the presence of the mechanically stronger polycrystalline GaN layer, the GaN article did not crack vertically during the laterally cracking separation. The freestanding 2" GaN article was crack-free. The thickness of the freestanding GaN article was about 2.1 mm.

The top surface of the freestanding GaN was polycrystalline material and the bottom surface was the nitrogen face (N-face) of the single crystalline GaN. The bottom surface was not flat because it was generated from lateral cracking.

The 2" freestanding GaN article was processed into 2" GaN wafer. First, edge grinding was performed to make into within 0.005" tolerance of the 2" wafer diameter. Because the initial sapphire had a major flat, the grown GaN article also had a flat. The ground 2" GaN article is called wafer blank herein.

The 2" GaN wafer blank was mounted on a fixture using wax with the front surface facing the fixture. The back surface (N-face) was lapped on a metal plate with diamond slurry until a uniform surface finish was achieved. At this stage, the thickness of the blank was about 1.8 mm. The 2" GaN wafer blank was removed from the fixture and mounted again using wax with the back side facing the fixture. The front side was lapped on a metal plate with diamond slurry. About 1.3 mm of the front material was removed. At this stage, the polycrystalline material was completely removed, resulting in a 2" single crystalline GaN wafer about 500 micron thick. Because iron doping was used during the growth, the GaN wafer was semi-insulating with a resistivity greater than $10^6$ ohm-cm.

The foregoing examples utilized AlN-coated sapphire as the substrate for the GaN crystal growth. As previously noted, other substrates, coated with another type of Group III nitride such as GaN or more generally (Al, Ga, In)N, may also be used in the present invention and thus are included within the scope of the invention. In other HVPE reactor systems that enable direct nucleation of single crystalline GaN film on bare sapphire substrate, bare sapphire may be used as substrate for the bulk GaN growth according to the present invention. GaN wafers, which may be produced according to implementations of the present invention, may also be used as the substrate for the bulk GaN crystal growth. Other substrates; such as silicon, silicon carbide, gallium arsenide, lithium gallate, lithium aluminate, zinc oxide, spinel, may be used as the substrate.

The examples of the present invention utilized several specific growth sequences. It should be understood that these specific growth process are meant for illustrative purposes and are not limiting. It should also be noted that growth conditions cited in the examples are specific to the HVPE growth reactor employed in the examples. When employing a different reactor design or reactor geometry, it may be desirable to utilize a different condition to achieve similar results. However, the general trends are still similar.

The techniques described in the present disclosure for making free-standing GaN substrates from those of the prior art. In one aspect, methods of the present disclosure generate lateral cracks in GaN to separate GaN from the substrate. In another aspect, methods of the present disclosure employ several layers of GaN grown under different conditions to control the stress in the GaN film and promote the separation of GaN from the underlying substrate. In another aspect, methods of the present disclosure do not rely on the creation of voids in the films.

It will be apparent to those skilled in the art that various modifications and variations can be made in the growth of the bulk GaN crystal within the scope of the present invention. Thus it is construed that the present invention covers the variations and modifications of this invention provided they come within the scope of the appended claims and their equivalent.

What is claimed is:

1. A method of forming a semiconductor structure, the method comprising:
    forming, over a substrate, a single-crystalline layer comprising a first III-nitride semiconductor material; and
    forming, over the single-crystalline layer, a polycrystalline layer comprising a second III-nitride semiconductor material, thereby forming the semiconductor structure.

2. The method of claim 1, wherein the first III-nitride semiconductor material and the second III-nitride semiconductor material are the same.

3. The method of claim 1, wherein the substrate is selected from the group consisting of sapphire, silicon carbide, gallium arsenide, zinc oxide, silicon, spinel, lithium gallate, and lithium aluminate.

4. The method of claim 1, further comprising, prior to forming the single-crystalline layer, forming an epitaxial nitride layer over the substrate.

5. The method of claim 4, wherein the epitaxial nitride layer comprises a material selected from the group consisting of GaN, AlN, InN, and ternary and quaternary alloys and mixtures including one or more thereof.

6. The method of claim 4, wherein forming the epitaxial nitride layer comprises sputtering.

7. The method of claim 1, wherein forming the single-crystalline layer comprises:
    forming a nucleation layer over the substrate under a substantially three-dimensional growth mode; and
    forming a bulk layer over the nucleation layer under a substantially two-dimensional growth mode.

8. The method of claim 7, wherein the nucleation layer and the bulk layer each comprise a material selected from the group consisting of GaN, AlN, InN, and ternary and quaternary alloys and mixtures including one or more thereof.

9. The method of claim 7, wherein forming the single-crystalline layer comprises forming, between the nucleation layer and the bulk layer, a transitional layer under a growth mode that changes from the substantially three-dimensional growth mode to the substantially two-dimensional growth mode.

10. The method of claim 9, wherein the transitional layer comprises a material selected from the group consisting of GaN, AlN, InN, and ternary and quaternary alloys and mixtures including one or more thereof.

11. The method of claim 1, wherein the second III-nitride semiconductor material comprises a material selected from the group consisting of GaN, AlN, InN, and ternary and quaternary alloys and mixtures including one or more thereof.

12. The method of claim 1, wherein forming the single-crystalline layer comprises doping with at least one of an n-type dopant, a p-type dopant, or a deep-level acceptor.

13. The method of claim 1, wherein the polycrystalline layer is formed at an elevated temperature greater than approximately 850° C., and further comprising cooling the semiconductor structure from the elevated temperature.

14. The method of claim 13, wherein the substrate separates from at least a portion of the single-crystalline layer during cooling.

15. The method of claim 13, wherein the semiconductor structure is cooled at a rate less than approximately 20° C. per minute.

16. The method of claim 1, further comprising removing the polycrystalline layer from the single-crystalline layer.

17. The method of claim 16, wherein removing the polycrystalline layer comprises at least one of grinding, lapping, or polishing.

18. The method of claim 16, further comprising processing the single-crystalline layer by at least one of planarization, polishing, chemical-mechanical polishing, grinding or lapping.

* * * * *